(12) United States Patent
Arvelo et al.

(10) Patent No.: US 9,341,418 B2
(45) Date of Patent: May 17, 2016

(54) THERMAL TRANSFER STRUCTURE WITH IN-PLANE TUBE LENGTHS AND OUT-OF-PLANE TUBE BEND(S)

(71) Applicant: INTERNATIONAL BUSINESS MACHINES CORPORATION, Armonk, NY (US)

(72) Inventors: Amilcar R. Arvelo, Poughkeepsie, NY (US); Mark A. Brandon, Poughkeepsie, NY (US); Levi A. Campbell, Poughkeepsie, NY (US); Michael J. Ellsworth, Jr., Poughkeepsie, NY (US); Randall G. Kemink, Poughkeepsie, NY (US); Eric J. McKeever, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 559 days.

(21) Appl. No.: 13/782,384

(22) Filed: Mar. 1, 2013

(65) Prior Publication Data
US 2014/0246174 A1 Sep. 4, 2014

(51) Int. Cl.
*H05K 7/20* (2006.01)
*F28F 1/12* (2006.01)
(Continued)

(52) U.S. Cl.
CPC . *F28F 1/12* (2013.01); *B23P 15/26* (2013.01); *F28F 1/00* (2013.01); *H05K 7/20763* (2013.01); *H05K 7/20772* (2013.01); *Y10T 29/4935* (2015.01)

(58) Field of Classification Search
CPC ........... H05K 7/20254; H05K 7/20272; H01L 23/473; F28F 1/00; B23P 15/26

USPC ........ 165/80.2, 80.4, 104.11, 104.21, 104.33; 361/699
See application file for complete search history.

(56) References Cited

U.S. PATENT DOCUMENTS

| 4,344,482 | A | * | 8/1982 | Dietzsch | F25B 39/04 165/150 |
| 4,349,070 | A | * | 9/1982 | Zinn | B29C 47/0028 165/173 |

(Continued)

FOREIGN PATENT DOCUMENTS

JP 2011-125893 A 6/2011

*Primary Examiner* — Leonard R Leo
*Assistant Examiner* — Gustavo Hincapie Serna
(74) *Attorney, Agent, or Firm* — Margaret A. McNamara, Esq.; Kevin P. Radigan, Esq.; Heslin Rothenberg Farley & Mesiti P.C.

(57) ABSTRACT

Cooling apparatuses and coolant-cooled electronic assemblies are provided which include a thermal transfer structure configured to couple to and cool one or more electronic components. The thermal transfer structure includes a thermal spreader, and at least one coolant-carrying tube coupled to the thermal spreader. The coolant-carrying tube(s) includes multiple tube lengths disposed substantially in a common plane, and an out-of-plane tube bend. The out-of-plane tube bend is couples in fluid communication first and second tube lengths of the multiple tube lengths, and extends out-of-plane from the multiple tube lengths disposed in the common plane. The first and second tube lengths may be spaced apart, with a third tube length disposed between them, and the coolant-carrying tube(s) further includes an in-plane tube bend which couples in fluid communication the third tube length and a fourth tube length of the multiple tube lengths.

12 Claims, 21 Drawing Sheets

(51) Int. Cl.
*F28F 1/00* (2006.01)
*B23P 15/26* (2006.01)

(56) References Cited

U.S. PATENT DOCUMENTS

| | | | |
|---|---|---|---|
| 4,607,690 A | 8/1986 | Seshamani | |
| 4,701,829 A | 10/1987 | Bricaud et al. | |
| 5,036,909 A * | 8/1991 | Whitehead | F28D 1/0391 165/133 |
| 5,531,268 A * | 7/1996 | Hoshino | F28D 1/0476 165/149 |
| 6,546,999 B1 * | 4/2003 | Dienhart | F28D 1/0476 165/150 |
| 6,808,013 B2 * | 10/2004 | Lai | F28F 7/02 165/104.21 |
| 6,820,685 B1 * | 11/2004 | Carter | F28B 1/06 165/150 |
| 6,942,019 B2 | 9/2005 | Pikovsky et al. | |
| 7,104,314 B2 * | 9/2006 | Valensa | F28D 7/0033 165/164 |
| 7,434,308 B2 | 10/2008 | Lu et al. | |
| 7,451,806 B2 | 11/2008 | Zhou et al. | |
| 7,548,426 B2 * | 6/2009 | Liu | H01L 23/4006 165/104.21 |
| 7,564,685 B2 | 7/2009 | Clidaras et al. | |
| 7,609,521 B2 * | 10/2009 | Wu | F28D 15/0275 165/104.33 |
| 2003/0230399 A1 * | 12/2003 | Hurlbert | F28D 1/0246 165/104.25 |
| 2008/0087406 A1 | 4/2008 | Asfia et al. | |
| 2009/0101308 A1 | 4/2009 | Hardesty | |
| 2010/0025010 A1 * | 2/2010 | Cipolla | H01L 23/4093 165/47 |
| 2013/0213626 A1 * | 8/2013 | Anderson | B23P 15/26 165/177 |

* cited by examiner

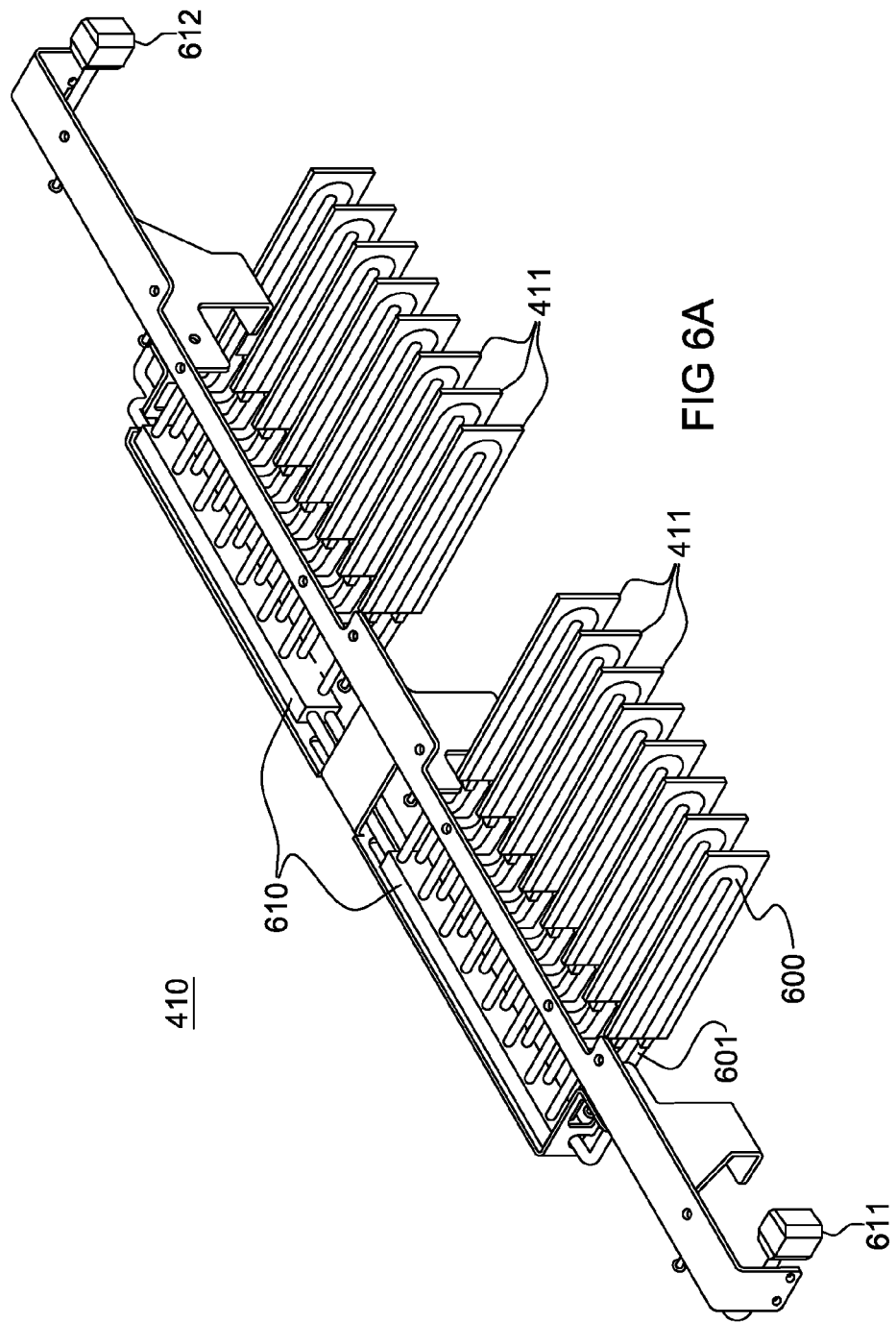

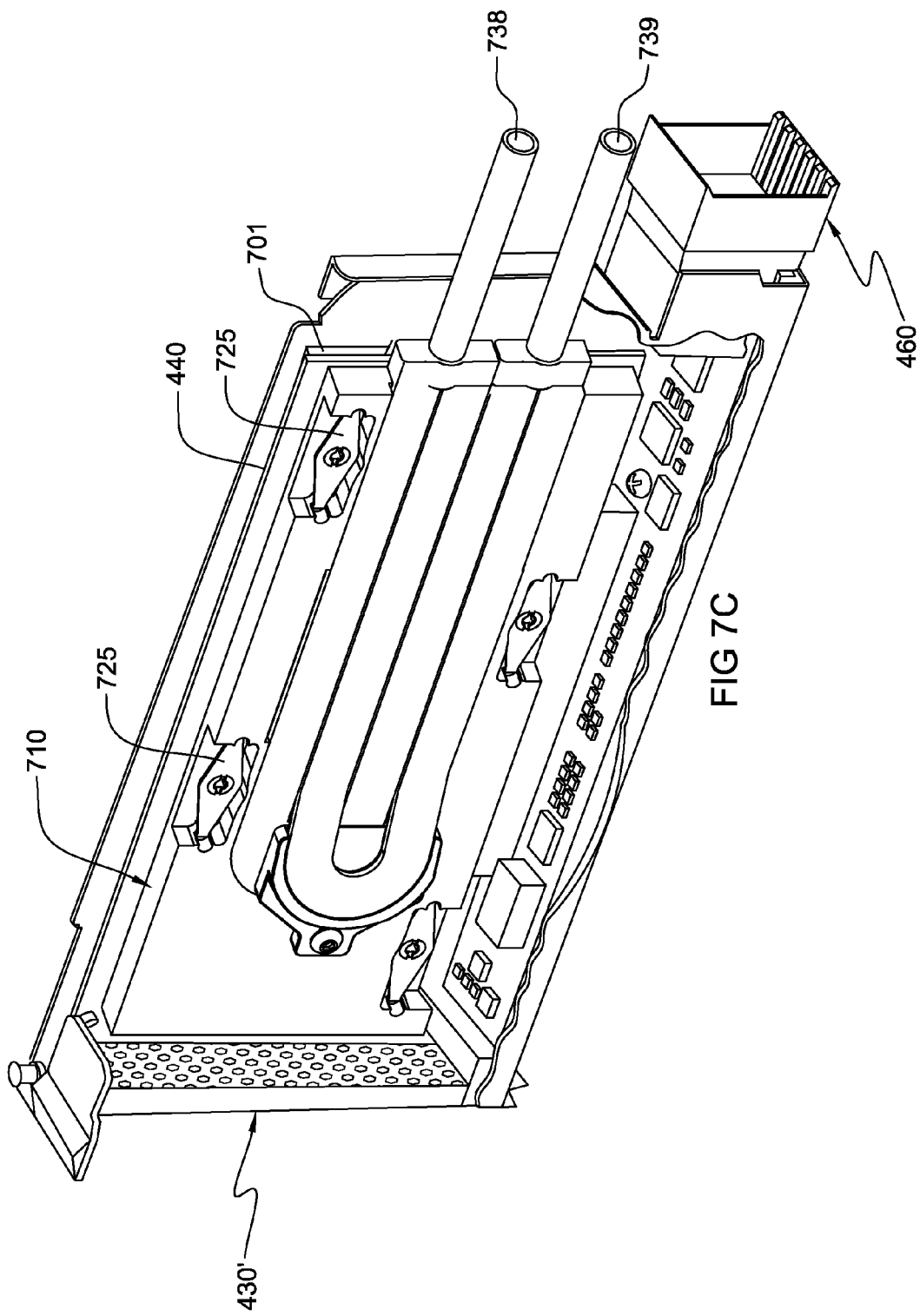

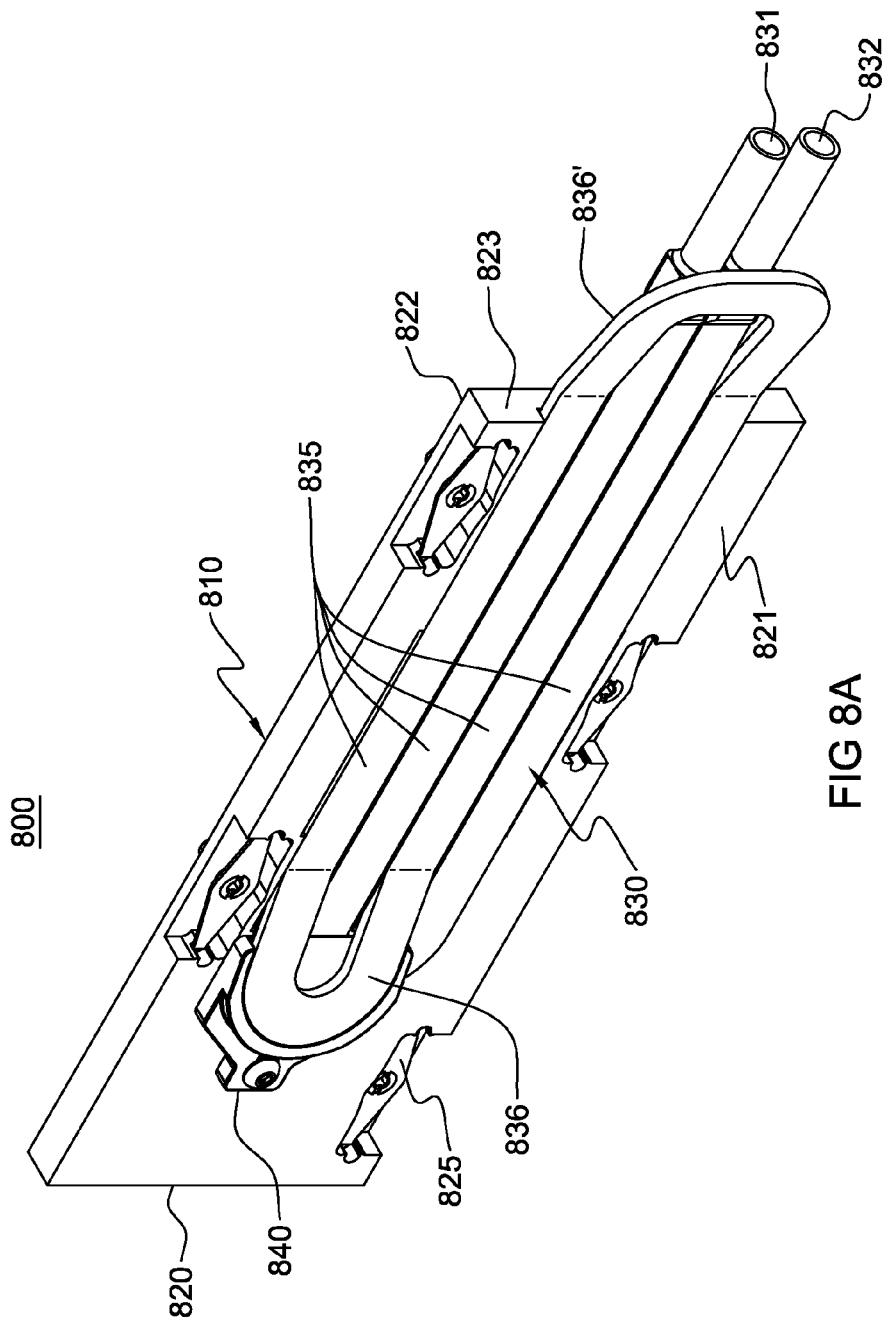

THERMAL TRANSFER STRUCTURE WITH IN-PLANE TUBE LENGTHS AND OUT-OF-PLANE TUBE BEND(S)

BACKGROUND

As is known, operating electronic components, such as processor modules, produce heat. This heat should be removed from the components in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern electronic components and electronic systems containing such components, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

The shortcomings of the prior art are overcome and additional advantages are provided through the provision, in one aspect, of a cooling apparatus which includes a thermal transfer structure. The thermal transfer structure includes a thermal spreader and at least one coolant-carrying tube coupled to and in thermal contact with the thermal spreader. The at least one coolant-carrying tube includes: multiple tube lengths disposed substantially in a common plane; and at least one out-of-plane tube bend, one out-of-plane tube bend of the at least one out-of-plane tube bend coupling in fluid communication a first tube length and a second tube length of the multiple tube lengths, the one out-of-plane tube bend extending out-of-plane from the multiple tube lengths disposed in the common plane.

In another aspect, a coolant-cooled electronic assembly is provided which includes at least one electronic component to be cooled, and a cooling apparatus which comprises a thermal transfer structure. The thermal transfer structure includes a thermal spreader and at least one coolant-carrying tube coupled to and in thermal contact with the thermal spreader. The at least one coolant-carrying tube includes: multiple tube lengths disposed substantially in a common plane; and at least one out-of-plane tube bend, one out-of-plane tube bend of the at least one out-of-plane tube bend coupling in fluid communication a first tube length and a second tube length of the multiple tube lengths, the one out-of-plane tube bend extending out-of-plane from the multiple tube lengths disposed in the common plane.

In a further aspect, a method of fabricating a coolant-cooled electronic assembly is provided, which includes: providing at least one electronic component to be cooled; and coupling a thermal transfer structure of a cooling apparatus to the at least one electronic component to be cooled, wherein the thermal transfer structure includes: a thermal spreader; and at least one coolant-carrying tube coupled to and in thermal contact with the thermal spreader. The at least one coolant-carrying tube includes multiple tube lengths disposed substantially in a common plane, and at least one out-of-plane tube bend. One out-of-plane tube bend of the at least one out-of-plane tube bend couples in fluid communication a first tube length and a second tube length of the multiple tube lengths. The one out-of-plane tube bend extends out-of-plane from the multiple tube lengths disposed in the common plane.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A is a partial embodiment of a cooling apparatus sub-assembly, which includes a plurality of coolant-cooled structures and associated coolant manifolds, for disposition within an electronic system such as depicted in FIG. 4, in accordance with one or more aspects of the present invention;

FIG. 7C depicts one embodiment of an electronics card with the thermal transfer structure of FIGS. 7A & 7B coupled thereto, in accordance with one or more aspects of the present invention;

FIG. 8A depicts an alternate embodiment of a thermal transfer structure of a cooling apparatus, in accordance with one or more aspects of the present invention;

DETAILED DESCRIPTION

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or sub-systems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold wall" refer to thermally conductive structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold wall. In one example, the channel(s) may be formed by providing tubing extending through the coolant-cooled structure.

One example of coolant used within the cooling apparatuses and coolant-cooled electronic assemblies or systems disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

Figure 1:
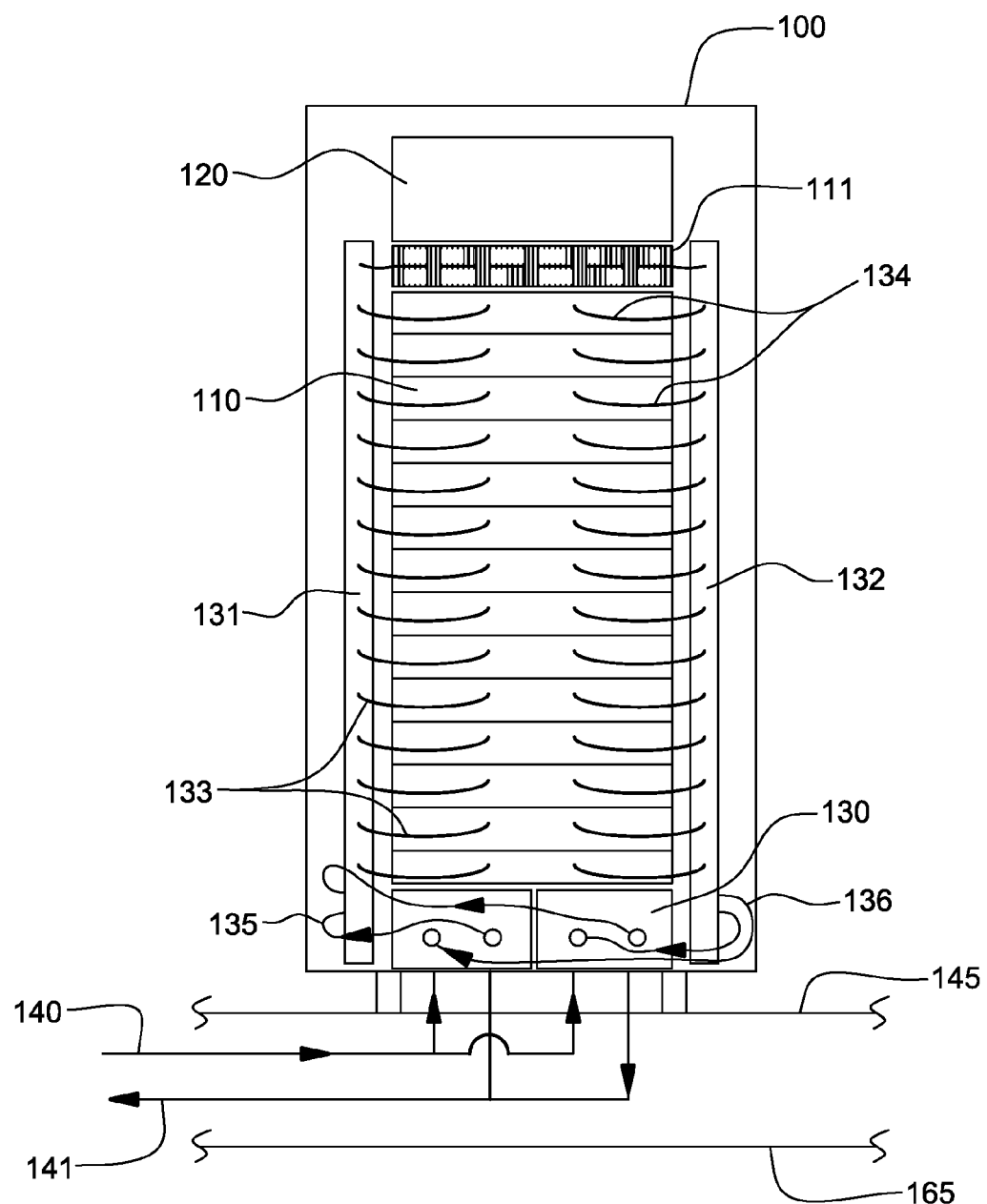
FIG. 1 is an elevational view of one embodiment of a coolant-cooled electronics rack comprising multiple coolant-cooled electronic systems, one or more of which may accommodate one or more electronic components and a cooling apparatus, in accordance with one or more aspects of the present invention.

FIG. 1 depicts one embodiment of a liquid-cooled electronics rack 100 which employs a liquid-based cooling system. In one embodiment, liquid-cooled electronics rack 100 comprises a plurality of electronic systems 110, which comprise processor or server nodes, as well as (for instance) a disk enclosure or structure 111. By way of example only, a bulk power assembly 120 is shown disposed at an upper portion of liquid-cooled electronics rack 100, and two modular cooling units (MCUs) 130 are disposed in a lower portion of the coolant-cooled electronics rack. In the embodiments described herein, the coolant is assumed to be water or an aqueous-based solution, again, by way of example only.

In addition to MCUs 130, the cooling system includes a system coolant supply manifold 131, a system coolant return manifold 132, and manifold-to-node fluid connect hoses 133 coupling system coolant supply manifold 131 to coolant-cooled electronic structures 110, 111 and node-to-manifold fluid connect hoses 134 coupling the individual coolant-cooled electronic systems 110, 111 to system coolant return manifold 132. Each MCU 130 is in fluid communication with system coolant supply manifold 131 via a respective system coolant supply hose 135, and each MCU 130 is in fluid communication with system coolant return manifold 132 via a respective system coolant return hose 136.

As illustrated, heat load of the electronics structures is transferred from the system coolant to, for instance, cooler facility coolant supplied by facility coolant supply line 140 and facility coolant return line 141 disposed, in the illustrated embodiment, in the space between a raised floor 145 and a base floor 165.

Figure 2:
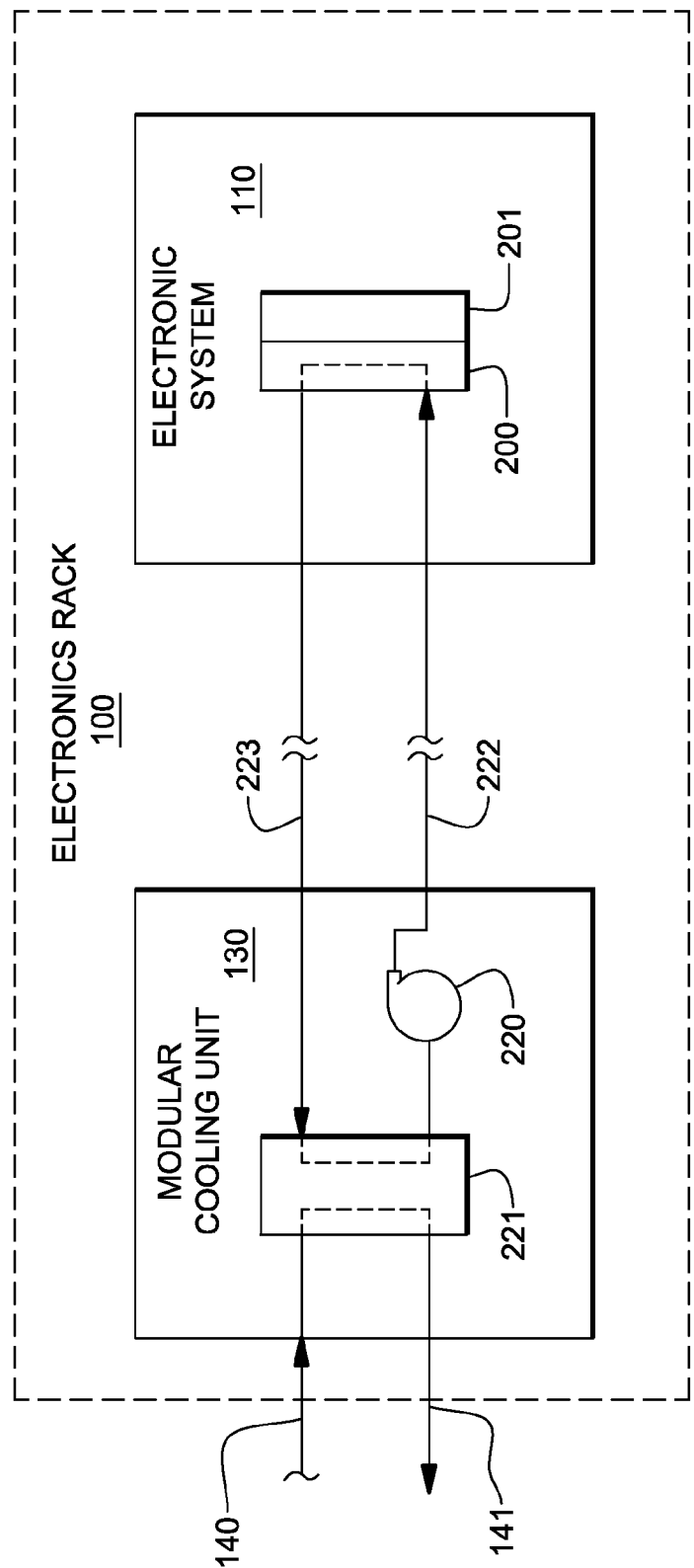
FIG. 2 is a schematic of one embodiment of a coolant-cooled electronic system, wherein an electronic component, such as an electronics card, is indirectly coolant-cooled by system coolant provided by one or more modular cooling units, in accordance with one or more aspects of the present invention.

FIG. 2 schematically illustrates operation of the cooling system of FIG. 1, wherein a coolant-cooled cold plate 200 is shown coupled to an electronics card 201 of an electronic system 110 within the coolant-cooled electronics rack 100.

Heat is removed from electronics card 201 via the system coolant circulated via pump 220 through cold plate 200 within the system coolant loop defined by liquid-to-liquid heat exchanger 221 of modular cooling unit 130, lines 222, 223 and cold plate 200. The system coolant loop and modular cooling unit are designed to provide coolant of a controlled temperature and pressure, as well as controlled chemistry and cleanliness to the electronics card(s). Furthermore, the system coolant is physically separate from the less controlled facility coolant in lines 140, 141, to which heat is ultimately transferred.

Figure 3:
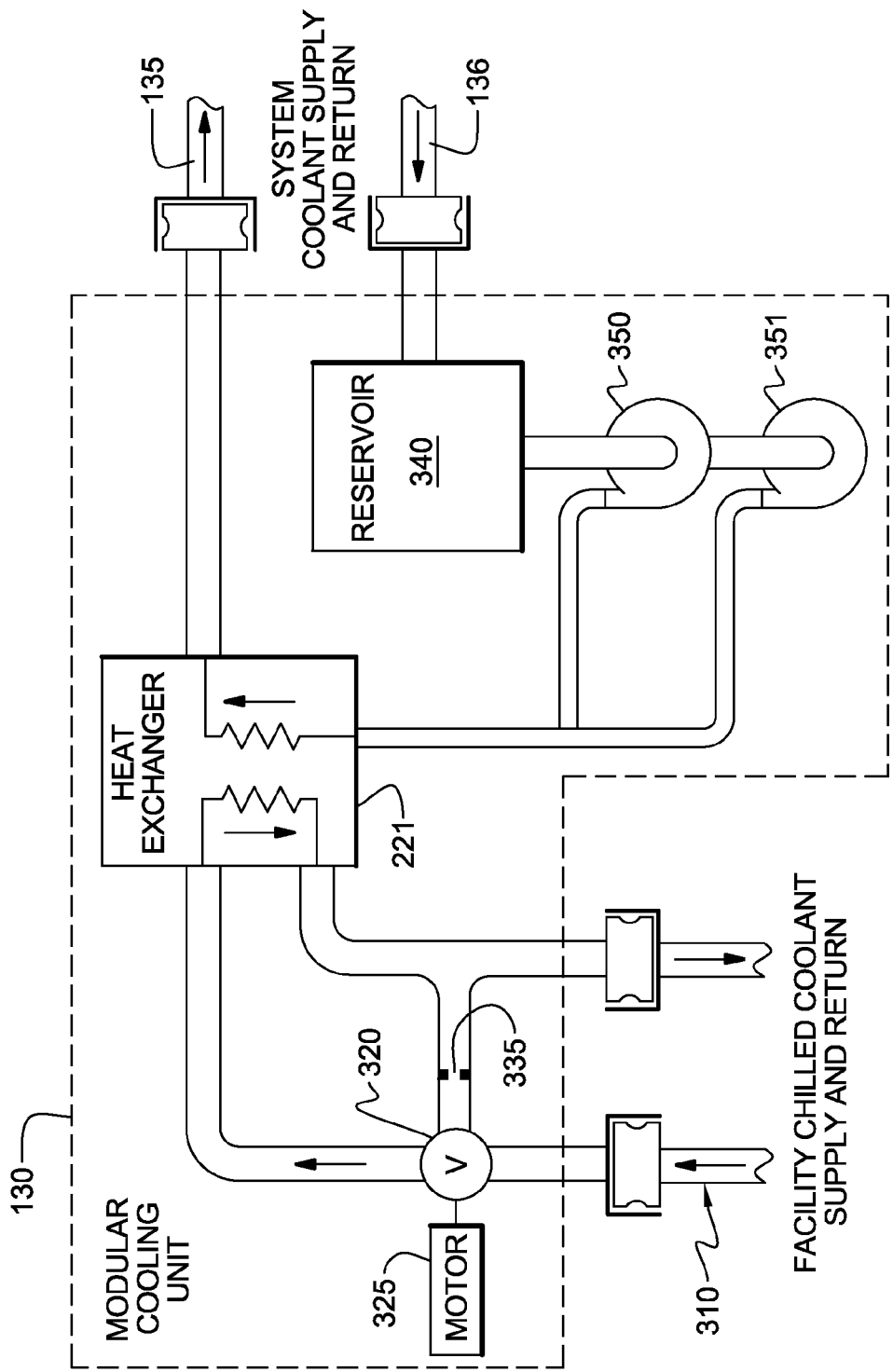
FIG. 3 is a schematic of one embodiment of a modular cooling unit for a coolant-cooled electronics rack such as depicted in FIGS. 1 & 2, in accordance with one or more aspects of the present invention.

FIG. 3 depicts a more detailed embodiment of a modular cooling unit 130, in accordance with an aspect of the present invention. As shown in FIG. 3, modular cooling unit 130 includes a facility coolant loop wherein building chilled, facility coolant is supplied 310 and passes through a control valve 320 driven by a motor 325. Valve 320 determines an amount of facility coolant to be passed through liquid-to-liquid heat exchanger 221, with a portion of the facility coolant possibly being returned directly via a bypass orifice 335. The modular cooling unit further includes a system coolant loop with a reservoir tank 340 from which system coolant is pumped, either by pump 350 or pump 351, into the heat exchanger 221 for conditioning and output thereof, as cooled system coolant to the electronics rack to be cooled. The cooled system coolant is supplied to the system supply manifold and system return manifold of the liquid-cooled electronics rack via the system water supply hose 135 and system water return hose 136.

As noted, an electronics rack may include one or more electronic systems, such as one or more server units, within which packaging density continues to increase, along with power dissipation. These trends necessitate that more and more electronic system components be principally directly or indirectly liquid-cooled, such as with water, refrigerant, etc., rather than air-cooled. Many electronic system architectures also require that certain components be serviceable without interruption of the electronic system. Conventionally, most serviceable or field-replaceable cards or components are air-cooled. A main disadvantage to air-cooled, serviceable components is that packaging and power density is limited, and fan or blower noise associated with the air cooling can become excessive. If serviceable cards or components are to be coolant-cooled (e.g., water, refrigerant, etc.), they would typically be serviced by disconnecting multiple coolant connections, as well as electrical connectors or cables. The disadvantage to such a cooling approach is that the need to disconnect coolant connections within an electronic system creates potential leak paths, and the approach requires a highly-parallel, coolant flow architecture to ensure servicing a component, such as a field-replaceable unit or card, does not interrupt coolant flow to one or more other components not being serviced. Addressing this disadvantage, disclosed herein (in one aspect) are cooling apparatuses and methods for facilitating liquid-coolant cooling of high-power-density, serviceable electronics cards or components, without having to connect or disconnect any coolant connections during insertion or removal of an electronics card.

Generally stated, in one embodiment, the cooling apparatuses disclosed herein include a thermal transfer structure configured to couple to an electronics card or component. Note that as used herein, an "electronics card" may comprise, for instance, a board or substrate upon which one or more electronic components are disposed. In one example, the electronic components may comprise a processor module and one or more support modules, such as one or more memory support modules, and one or more dynamic random access memory (DRAM) modules.

In one embodiment, the thermal transfer structure includes, for instance, a clamping structure movable between an opened position and a clamped position. The cooling apparatus further includes a coolant-cooled (e.g., liquid-cooled) structure disposed within, and associated with a receiving slot of, an electronic system within which the electronics card is to be operatively inserted. The coolant-cooled structure resides between the electronics card and, at least partially, the clamping structure with operative insertion of the electronics card into the receiving slot of the electronic system. In operation, the opened position of the clamping structure facilitates insertion of the electronics card into the electronic system with the coolant-cooled structure disposed between the electronics card and, at least partially, the clamping structure, and movement of the clamping structure to the clamped position facilitates clamping of the thermal transfer structure to the coolant-cooled structure, and thereby enhancing thermal conduction of heat from the electronics card to the coolant-cooled structure by providing a good mechanical and thermal coupling to the coolant-cooled structure.

In a further embodiment, the thermal transfer structure includes a thermal spreader which has opposite main surfaces comprising a first thermal conduction surface and a second thermal conduction surface. The first thermal conduction surface is configured to couple to the electronics card to facilitate conduction of heat from the electronics card to the thermal spreader. For instance, the first thermal conduction surface may have appropriately sized recesses or regions so that one or more electronic components (e.g., integrated circuit chips or devices) mounted to the electronics card make good thermal contact to the thermal spreader, and in one embodiment, the thermal spreader makes good thermal contact to the card or substrate of the electronics card. When the electronics card with the attached thermal transfer structure is operatively inserted into the electronic system, for example, docked within a respective receiving slot, the coolant-cooled structure resides between the second thermal conduction surface of the thermal spreader and, for instance, a lid of the clamping structure. In the opened position of the clamping structure, insertion of the electronics card into the electronic system is facilitated with the coolant-cooled structure of the electronic system being disposed between the thermal spreader and the lid of the clamping structure, and movement of the clamping structure to the clamped position facilitates clamping of the thermal transfer structure to the coolant-cooled structure, and thus enhanced thermal conduction of heat from the thermal spreader to the coolant-cooled structure.

More specifically, in one embodiment, the coolant-cooled structure may include a liquid-cooled cold plate or a liquid-cooled cold wall resident in the electronic system (e.g., server unit), for instance, within or associated with the receiving slot of the electronic system within which the electronics card is to be operatively inserted. The electronics card may be a high-power-density card assembly containing multiple electronic components, which can mechanically clamp itself, via the thermal transfer structure, to the coolant-cooled structure or cold wall after the electronics card is docked into the receiving slot and plugged into a respective electrical connector(s) resident within the electronic system. The coolant-cooled structure or cold wall may have coolant flowing through it in one or more coolant-carrying channels, and be sufficiently flexible in the direction that it is clamped so that clamping of the coolant-cooled structure to the electronics card via the thermal transfer structure will not put a significant load on the electrical connector(s) of the electronics card or the electrical backplane of the electronic system to which the card is connected. The cooling path from the electronics card to the coolant-cooled structure may be from the electronics card (i.e., the components mounted to the electronics card) through, for instance, a first thermal interface material (TIM1) to the heat spreader of the thermal transfer structure, and then through a second thermal interface material (TIM2) to the coolant-cooled structure. Note that the heat spreader also serves as a base to the mechanism referred to herein as the clamping structure. This structure is employed to clamp the coolant-cooled structure and thermal transfer structure together. The advantage of this cooling apparatus is that a high-power-density electronics card can be efficiently indirectly liquid-cooled via a cold plate and still be serviceable, without disconnecting any coolant connections within the electronic system.

Figure 4:
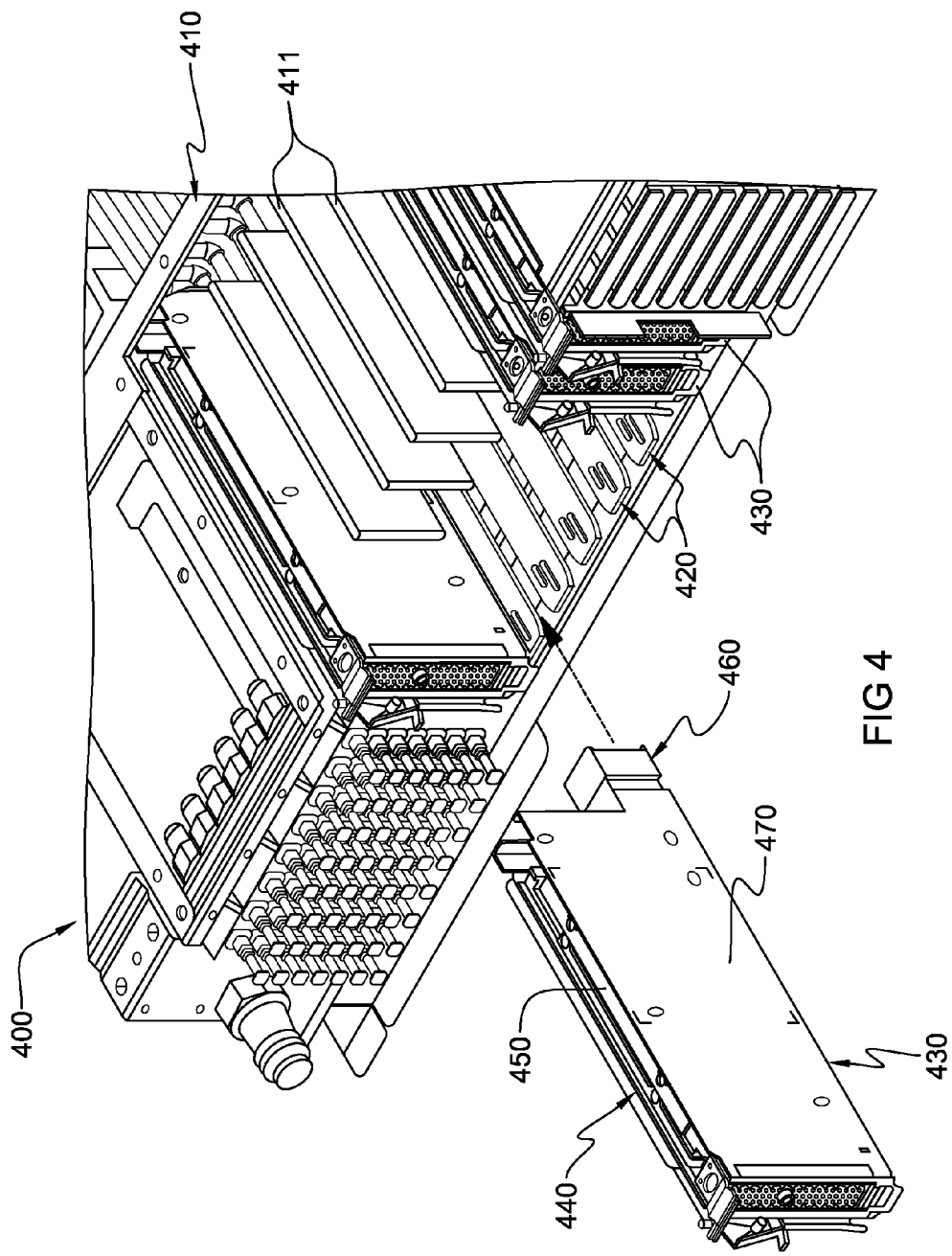
FIG. 4 is a partial isometric view of one embodiment of a coolant-cooled electronic assembly, with an electronics card and associated thermal transfer structure, shown being inserted into a receiving slot of the electronic system, in accordance with one or more aspects of the present invention.

FIG. 4 is a partial embodiment of an electronic system, generally denoted 400, utilizing a cooling apparatus, in accordance with one or more aspects of the present invention. The cooling apparatus includes a cooling apparatus subassembly 410 which comprises a plurality of coolant-cooled structures 411, each of which includes one or more coolant carrying channels through which a coolant, such as water circulates. In the embodiment depicted, the coolant-cooled structures 411 are suspended via the cooling apparatus subsystem 410 within or adjacent to respective receiving slots 420 of the electronic system into which serviceable or field-replaceable units 430 are docked for operative insertion into or undocked for removal from electronic system 400. A field-replaceable unit 430 includes, by way of example only, an electronics card 440 with a thermal transfer structure 450 coupled thereto. The electronics card electrically docks within an interposer card 460, and the resultant assembly is disposed within a cassette 470 (again by way of example only), to facilitate slideable insertion into or removal from a respective receiving opening 420 of electronic system 400. As disclosed herein, the respective coolant-cooled structure 411 disposed within or associated with the receiving slot 420 into which the field-replaceable unit 430 is docked projects into the cassette 470 with insertion of the field-replaceable unit 430 into the receiving slot 420. Once the electronics card is docked, the coolant-cooled structure resides between the electronics card 440 and, at least partially, a clamping structure of the thermal transfer structure 450, as explained below.

By way of further explanation, the electronics card may electrically connect to an electronic system back-plane (e.g., server back-plane), as the field-replaceable unit is slid into the electronic system, or more particular, one of the receiving slots of the electronic system, and a simple latch mechanism (not shown) may be used to secure the field-replaceable unit within the electronic system. The coolant-cooled structure (e.g., liquid-cooled cold wall) associated with the respective receiving slot that the unit slides into is positioned and configured to extend into (for instance) the thermal transfer structure of the replaceable unit so as to be between the electronics card and, at least partially, a clamping structure of the thermal transfer structure. In one assembly approach, before the electronics card is installed, a second thermal interface material (TIM2) is attached to, for instance, the second thermal conduction surface of the heat spreader to which the coolant-cooled (or liquid-cooled) structure is to be clamped. The particular interface material employed is designed to adhere to the heat spreader, yet be releasable from the coolant-cooled structure should the field-replaceable unit be removed or undocked from the electronic system, for instance, for servicing of the electronics card. As the field-replaceable unit slides into the receiving slot, the coolant-cooled structure slides between, for instance, the heat spreader and the lid of the clamping structure. Once the electrical connector(s) is fully plugged, and the field-replaceable unit or electronics card assembly is latched in place, an actuation mechanism, such as an actuator element or screw, may be turned or tightened to cause the clamping structure to clamp the thermal transfer structure and the coolant-cooled structure together in good physical and thermal contact. In one embodiment, a four-bar linkage assembly may be used as part of the clamping structure, movably securing the clamping structure to, for instance, the heat spreader of the thermal transfer structure. These structures and their operation are described further below with reference to the exemplary embodiments of FIGS. 5A-6C.

Figure 5A:
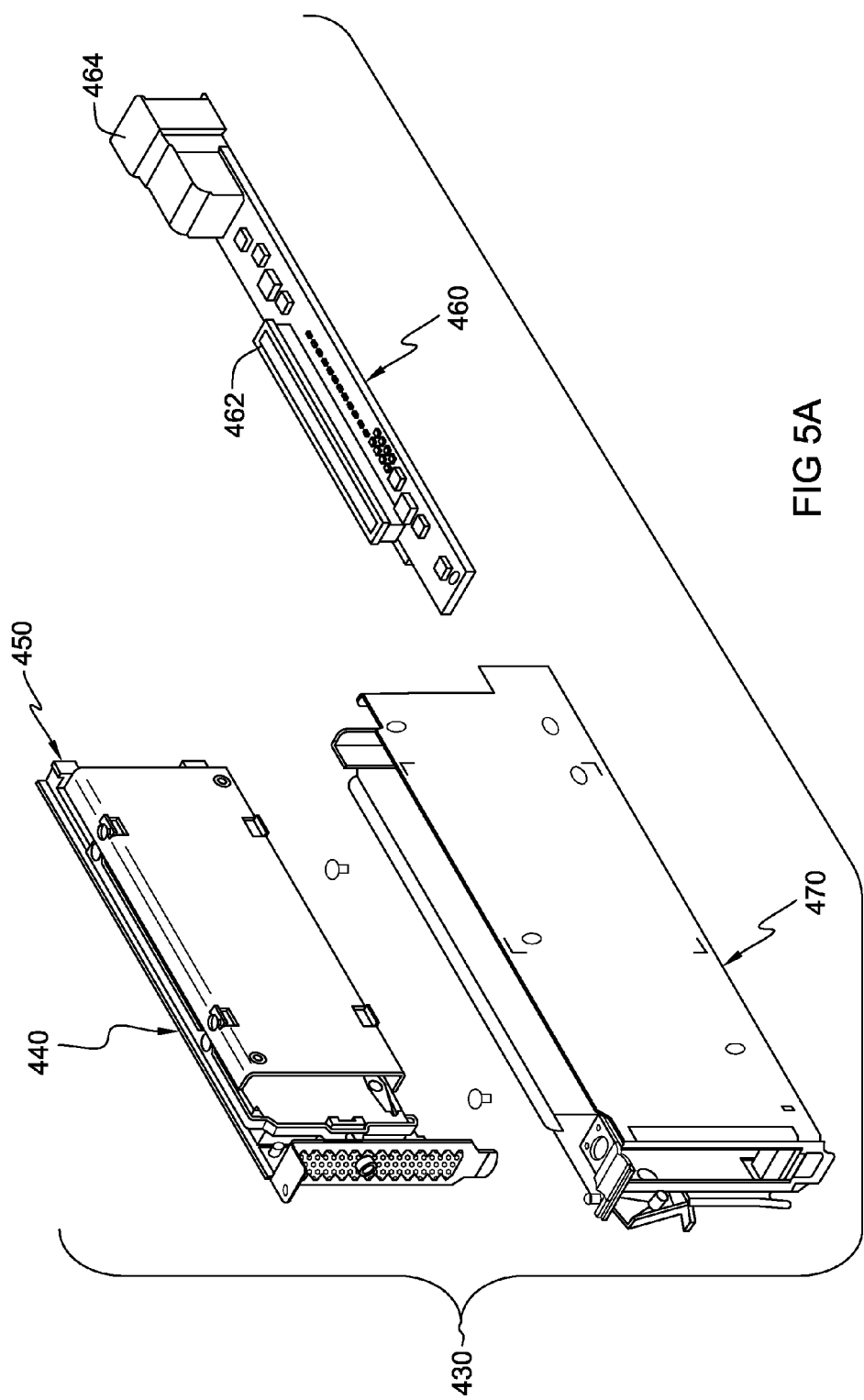
FIG. 5A is a partially exploded view of one embodiment of an electronics card and associated thermal transfer structure, shown exploded from a corresponding cassette chassis and interposer card, in accordance with one or more aspects of the present invention.

FIG. 5A is a partially exploded depiction of one embodiment of the field replaceable unit 430 of FIG. 4. In this embodiment, electronics card 440 is shown mechanically coupled to thermal transfer structure 450, and the electronics card 440 and thermal transfer structure 450 assembly operatively inserts into interposer card 460 disposed within cassette 470. Cassette 470 includes an appropriately sized cassette chassis, and as illustrated, interposer card 460 includes an electronics card socket 462 configured to operatively receive one or more electrical connections of electronics card 440 as the card is operatively positioned within cassette 470, with the interposer card 460 disposed in the lower portion thereof. Interposer card 460 also includes one or more electrical connectors 464 sized and configured to operatively couple to, for instance, an electrical or control back-plane (not shown) of the electronic system (see FIG. 4) within which the electronics card or, more generally, the field-replaceable unit is to be operatively inserted or docked.

Figure 5B:
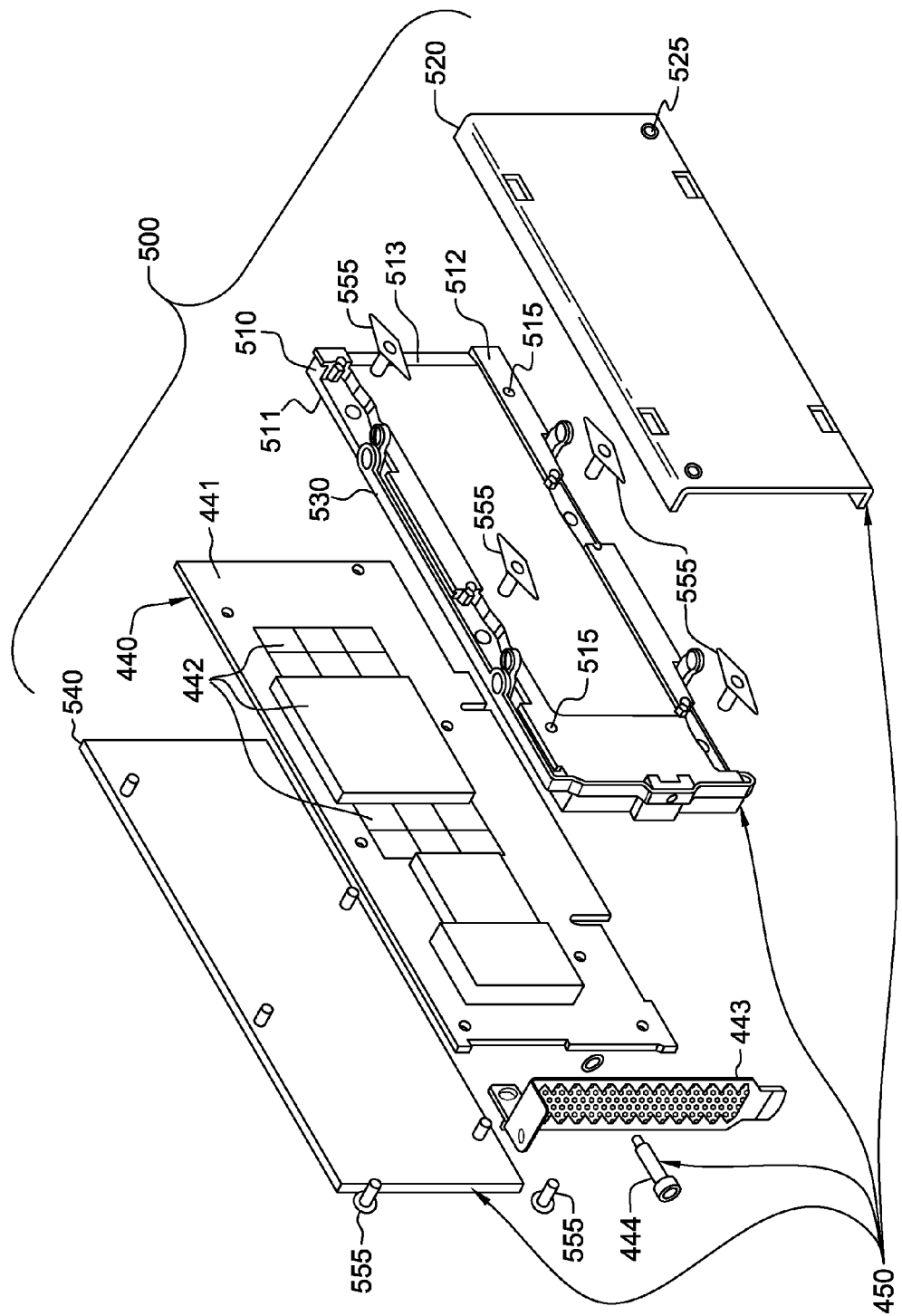
FIG. 5B is a partially exploded view of the electronics card and thermal transfer structure of FIG. 5A, in accordance with one or more aspects of the present invention.

FIG. 5B is a partially exploded view of one embodiment of an electronics card and thermal transfer structure assembly (or electronics card assembly) 500. In this embodiment, electronics card assembly 500 includes electronics card 440 comprising, for instance, a circuit board or substrate 441 to which one or more electronic components 442, such as integrated circuit chips, are mounted. In one embodiment, the one or more electronic components 442 may include a high-power-dissipating processor chip, as well as support chips such as a memory controller, and dynamic random access memory (DRAM) chips, etc.

FIG. 5B also depicts in greater detail one embodiment of a thermal transfer structure 450 such as disclosed herein. This thermal transfer structure 450 includes a thermal spreader 510 and a movable linkage assembly 530 of a clamping structure which includes (in this embodiment) a lid 520. A stiffener 540 is also provided, along with attachment fasters 555, which couple the thermal spreader 510 and stiffener 540 together with electronics card 440 sandwiched between the thermal spreader 510 and stiffener 540. In one embodiment, a first thermal conduction surface 511 of thermal spreader 510 is configured with one or more recesses (not shown) appropriately sized to receive corresponding electronic components 442 in good thermal contact with first thermal conduction surface 511. A second thermal conduction surface 512 of thermal spreader 510 may also include, in one embodiment, a partial recess 513 sized and configured to receivably engage a similarly configured coolant-cooled structure, or a portion thereof, as the electronics card assembly 500 within the field-replaceable unit is operatively inserted into the electronic system in a manner such as described herein.

Thermal spreader 510 and stiffener 540 may couple via a variety of attachment fasteners 555, including, for example, multiple load spring fasteners, which allow spring-biased coupling of the thermal spreader 510 and stiffener 540, with electronics card 440 sandwiched therebetween, and thus ensure good thermal contact between surfaces of the electronic components 442 (and possibly the electronics card 440 itself) and the first thermal conduction surface 511 of the thermal spreader 510. In addition, alignment pins 525 affixed to lid 520 reside within alignment holes 515 in thermal spreader 510, and maintain lid 520 aligned over thermal spreader 510 with movement of the lid between an opened position and a clamped position, as described herein. In this embodiment, a front tailstock 443 may reside at one edge of the electronics card assembly 500, along with an actuator element 444 connected to engage and threadably actuate movable linkage assembly 530 of the clamping structure. In one embodiment, actuator element 444 is an actuation screw which threadably inserts into a threaded opening within movable linkage assembly 530 and allows an operator to rotatably control movement of the assembly 530 and thus a clamping force applied between thermal spreader 510 and lid 520 when the electronics card assembly 500 is in operative position within a corresponding receiving slot of the electronic system, with the coolant-cooled structure (see FIG. 4) thereof disposed between thermal spreader 510 and lid 520.

Figure 5C:
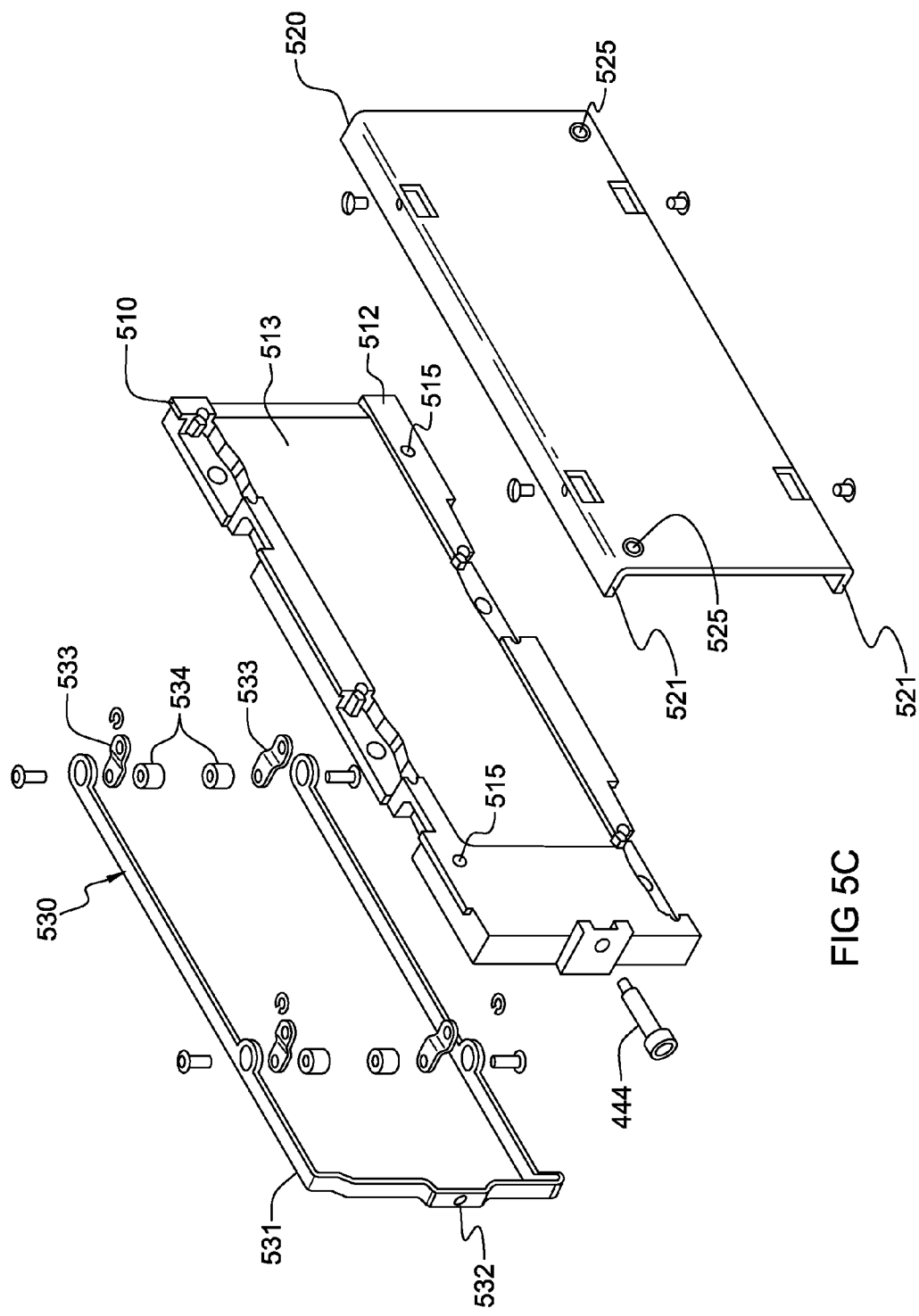
FIG. 5C is a partially exploded view of the thermal spreader, and clamping structure (including a moveable linkage assembly and lid) of the thermal transfer structure of FIGS. 5A & 5B, in accordance with one or more aspects of the present invention.

FIG. 5C depicts an exploded view of the thermal spreader 510 and the clamping structure, including movable linkage assembly 530 and lid 520. In this embodiment, the movable linkage assembly 530 includes a slide structure 531 having a threaded opening 532 at one end sized and positioned to threadably receive actuator element 444. Movable linkages 533 and cam followers 534 are employed to couple slide structure 531, thermal spreader 510 and lid 520 together such that the clamping structure is defined relative to thermal spreader 510. This clamping structure is movable between an opened position and a clamped position. In this embodiment, lid 520 is disposed in spaced opposing relation to second thermal conduction surface 512 of thermal spreader 510, which (as noted) may include a recess 513 sized and configured to at least partially, engagably receive the respective coolant-cooled structure (see FIG. 4) as the field-replaceable unit comprising the electronics card assembly is operatively inserted into a respective receiving slot of the electronic system. Note also with respect to FIG. 5C, that (in one embodiment) lid 520 includes sidewalls 521 which partially wrap around, for instance, the respective coolant-cooled structure once in the clamped position. These sidewalls 521 may be sized to physical contact the thermal spreader, and thereby facilitate enhanced heat transfer. In one embodiment, lid 520 is itself thermally conductive, being fabricated of, for instance, a metal or other thermally conductive material, to further improve heat transfer between the thermal spreader, and thus the electronics card and the coolant-cooled structure.

Figure 6B:
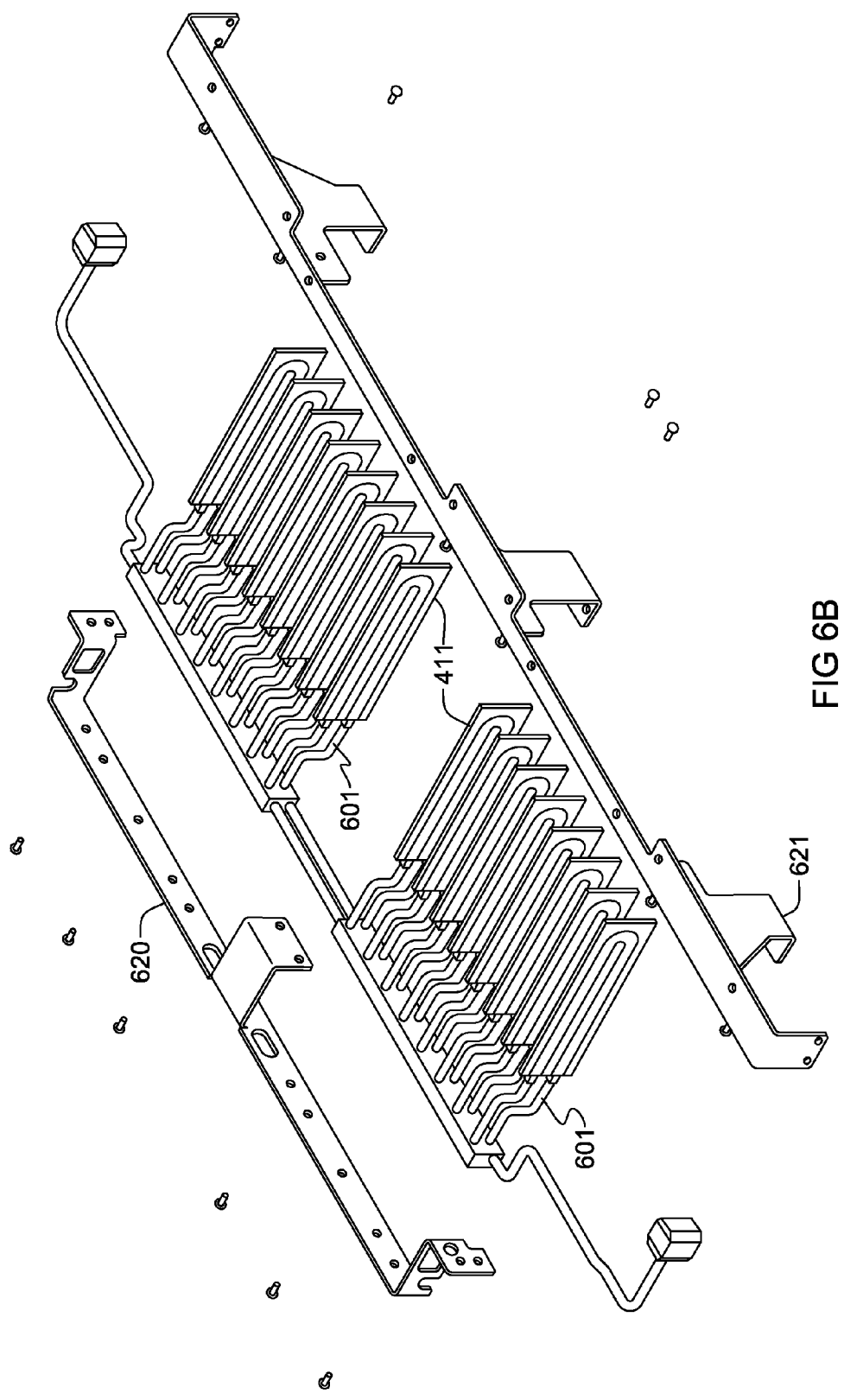
FIG. 6B is a partially exploded view of the cooling apparatus sub-assembly of FIG. 6A, in accordance with one or more aspects of the present invention.
Figure 6C:
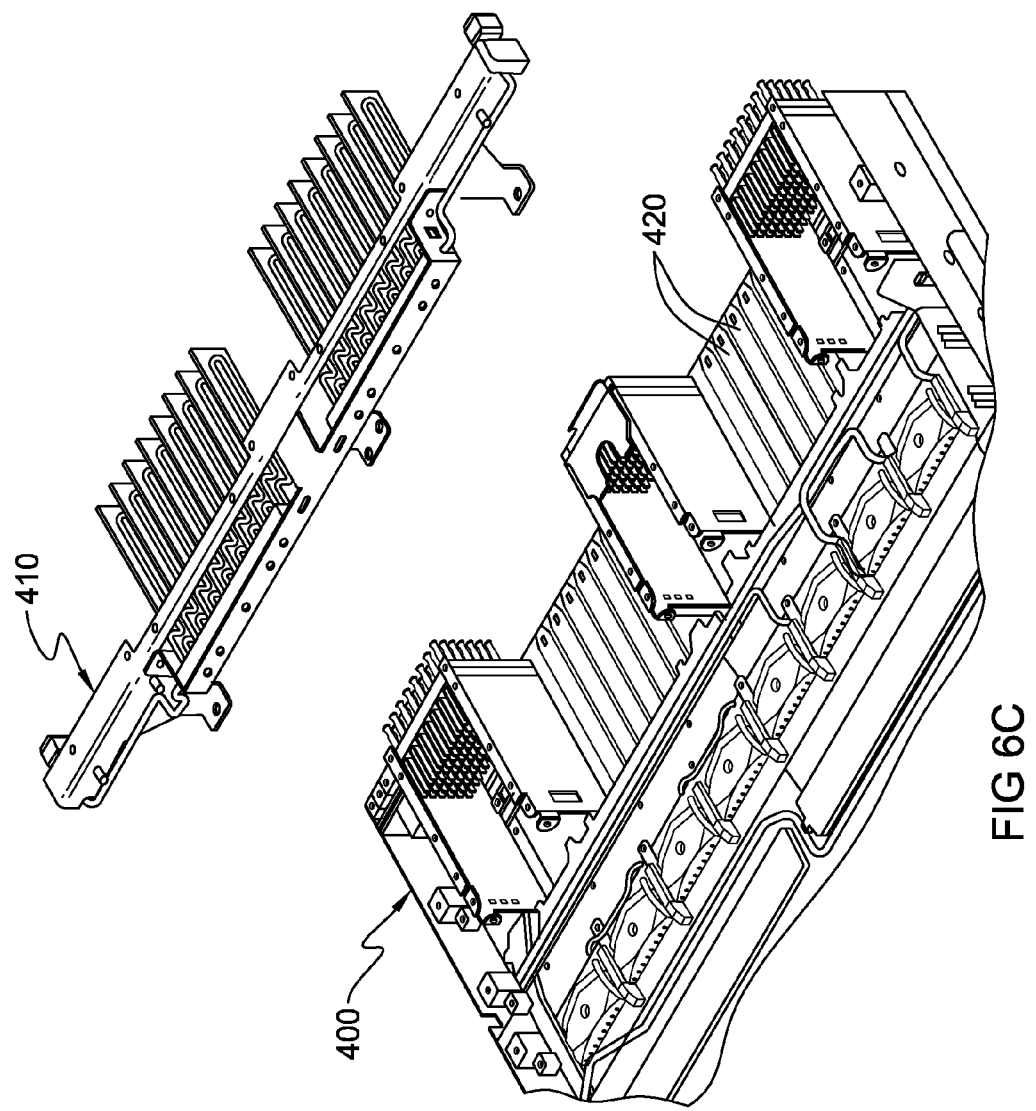
FIG. 6C depicts the cooling apparatus sub-assembly of FIGS. 6A & 6B, partially exploded from one embodiment of an electronic system within which a plurality of electronics cards to be cooled are to be operatively inserted, in accordance with one or more aspects of the present invention.

FIGS. 6A-6C depict one embodiment of cooling apparatus subassembly 410 of the cooling apparatus disclosed herein, and briefly described above in connection with FIG. 4. Referring to FIGS. 6A-6C collectively, two sets of coolant-cooled structures 411 are provided, each configured and positioned to extend into or be associated with a respective receiving slot of (in this example) two different sets of receiving slots in electronic system 400 for receiving electronics card assemblies, or more generally, field-replaceable units, such as described herein. Each coolant-cooled structure 411 includes one or more coolant-carrying channels 600 through which liquid coolant can circulate. In this embodiment, manifolds 610 are provided and coupled to a coolant supply connector 611 and a coolant return connector 612. These manifolds and connectors are configured and coupled in fluid communication to facilitate the flow of coolant through the respective coolant-carrying channels 600 of the coolant-cooled structures 411. In the embodiment depicted, each coolant-cooled structure is a substantially flat cold plate having (for instance) a tube-receiving recess within which a respective coolant-carrying tube 601 resides. The coolant-carrying tubes 601 define, in this example, the coolant-carrying channels through the coolant-cooled structure. In the embodiment depicted, the cold plates are oriented vertically on-edge as liquid-cooled cold walls. As noted, these coolant-cooled structures are positioned within or associated with respective receiving slots of the electronic system. Note with reference to FIGS. 6A-6C that the coolant flowing through the cooling apparatus subassembly 410 is sealed from leaking, notwithstanding insertion or removal of an electronics card assembly. That is, insertion or removal of the field-replaceable units (comprising the electronics card assemblies) is made without any coolant connection being affected.

As illustrated in FIG. 6B, the cooling apparatus subassembly 410 of FIGS. 6A-6C includes (in one embodiment) a manifold bracket 620 and a bulkhead bracket 621, which are sized and configured to provide appropriate support for the manifolds 610 and coolant-cooled structures 411. In one embodiment, the coolant-carrying tubes 601 are rigid tubes which have sufficient support to hold the coolant-cooled structures 411 suspended within or in association with a respective receiving slot of the electronic system.

FIG. 6C depicts the cooling apparatus subassembly 410 partially exploded from one embodiment of electronic system 400, and depicts the coolant-cooled structures 411 aligning over respective receiving slots 420 of the electronic system 400.

FIGS. 7A-10B depict additional embodiments of cooling apparatuses, in accordance with one or more aspects of the present invention. The embodiments depicted in these figures seek to maximize coolant-carrying tube coverage over a side of the thermal spreader, which is or is to be coupled to one or more electronic components to be cooled, such as one or more electronic components of an electronics card to be docked within an electronic system in a manner similar to that described above in connection with FIGS. 1-6C. Note, however, that in this embodiment, the thermal transfer structure includes a thermal spreader and one or more coolant-carrying tubes coupled to the thermal spreader, and that the coolant-carrying tube(s) is to be fluidically attached (in one embodiment) to a coolant assembly of the electronic system using, for instance, corresponding quick connect couplings, during docking of the electronics card within the electronic system.

Traditionally, the number of serpentine coolant-carrying tube passing over, through, or across a thermal spreader or cold plate, as well as the tube coverage area over a main surface of the thermal spreader, is limited by the bend radius of the tube. The minimum tube bend radius depends on the tube diameter and tube material. For instance, for ¼ inch copper tubing, a minimum bend radius of 8 mm is required to avoid tube damage during bending. As an alternative approach, the number of tube passes across the surface of a thermal spreader, and thus the tube area coverage over the surface of the thermal spreader, could be increased by providing a parallel flow approach using a supply manifold and return manifold off opposite edges of the thermal spreader. This approach comes with penalties though, and added risk, since there is a large increase in the number of brazed joints, each a potential leak site, and there is increased complexity and cost in manufacturing such a structure.

Generally stated, disclosed herein are various cooling apparatuses, or more particularly, various thermal transfer structures of cooling apparatuses, wherein the number of serpentine coolant-carrying tube passes across the surface of a thermal spreader is increased over what is achievable with conventional serpentine overlay approaches, resulting in achieving a structure with improved thermal performance.

In particular, disclosed herein (in one aspect) is a cooling apparatus which includes a thermal transfer structure configured to couple to one or more electronic components to be cooled. The thermal transfer structure includes a thermal spreader fabricated of thermally conductive material, and one or more coolant-carrying tubes coupled to and in thermal contact with the thermal spreader. The one or more coolant-carrying tubes are also fabricated of a thermally conductive material so that conducted heat from the one or more electronic components through the thermal spreader is conducted to the coolant-carrying tubes, and then transferred to coolant flowing through the coolant-carrying tube(s). The one or more coolant-carrying tubes include multiple tube lengths disposed substantially in a common plane, and at least one out-of-plane tube bend. One out-of-plane tube bend couples in fluid communication a first tube length and a second tube length of the multiple tube lengths, and extends out-of-plane from the multiple tube lengths disposed in the common plane.

In one embodiment, the first tube length and the second tube length are spaced apart, with a third tube length of the multiple tube lengths disposed therebetween, and the coolant-carrying tube(s) further includes at least one in-plane tube bend, with one in-plane tube bend coupling in fluid communication the third tube length and a fourth tube length of the multiple tube lengths. The one in-plane tube bend extends in the common plane of the multiple tube bends. In this manner, the out-of-plane tube bend and in-plane tube bend are interlocked or intertwined in plan view in the thermal transfer structure. In one embodiment, the one out-of-plane tube bend coupling in fluid communication the first tube length and the second tube length overlies, at least in part, and extends out-of-plane from the one in-plane tube bend coupling in fluid communication the third tube length and the fourth tube length. Note that, although described herein as separate elements, in the case of a single coolant-carrying tube, the first tube length, second tube length, out-of-plane tube bend, third tube length, fourth tube length, and in-plane tube bend, are different portions of the single coolant-carrying tube, which in one embodiment is overlaid in a serpentine shape. Further, note that these elements may be different portions of multiple coolant-carrying tubes, such as in the examples described below in the case of two coolant-carrying tubes.

In another aspect, the thermal transfer structure may include a first coolant-carrying tube and a second coolant-carrying tube, with the first coolant-carrying tube including the first tube length, the second tube length, and the out-of-plane tube bend, and the second coolant-carrying tube including the third tube length, the fourth tube length, and the in-plane tube bend. In one embodiment, the thermal transfer structure further includes a coolant supply manifold and a coolant return manifold, with the first and second coolant-carrying tubes being fluidically coupled in parallel between the coolant supply manifold and the coolant return manifold of the thermal transfer structure.

In implementation, the coolant-carrying tube(s) is, in one embodiment, at least partially embedded within the thermal spreader, and the multiple tube lengths disposed in the common plane are disposed in parallel, and cover a majority of one side (or main surface) of the thermal spreader. For instance, the multiple tube lengths may cover 70%, 80%, or more, of the surface area of one side of the thermal spreader for increased heat transfer from the thermal transfer structure.

In the implementations described below, the thermal transfer structure may further include one or more support wedges, each disposed between an out-of-plane tube bend and, in part, an in-plane tube bend. These support wedges are configured and sized to support the out-of-plane tube bends. In one implementation, the out-of-plane tube bends reside over the thermal spreader. In another embodiment, one or more of the out-of-plane tube bends extend past an edge of the thermal spreader so as not to overlie the thermal spreader.

In one implementation, the thermal spreader is fabricated of a first thermally conductive material, such as aluminum, and the one or more coolant-carrying tubes are fabricated of a second thermally conductive material, such as copper. In the implementations disclosed herein, the thermal spreader is a thermal-spreading plate, by way of example only. As a further example, the opposite side of the thermal spreader from the coolant-carrying tube(s) is configured or machined to couple to one or more electronic components to be cooled, such as one or more electronic components mounted to an electronics card. Further, in certain embodiments, one or more openings are provided within the thermal spreader to accommodate one or more corresponding electronic components therein, with the thickness of the thermal spreader and size and configuration of the openings in the thermal spreader being selected so that the one or more electronic components extending within the openings thereof are in direct contact with one or more tube lengths of the coolant-carrying tube(s) of the thermal transfer structure.

More particularly, disclosed herein with reference to the embodiments of FIGS. 7A-10B, are various thermal transfer structures which include a thermal spreader and one or more coolant-carrying tubes coupled to and in thermal communication with the thermal spreader. The embodiments depicted advantageously increase the number of tube passes (or tube lengths) that can be inserted or overlaid over a specific surface area of a thermal spreader, such as a plate, resulting in improved thermal performance solutions. In one approach, two copper pipes may be embedded in an aluminum plate to run in parallel, following a serpentine overlay pattern. To maximize coverage area of the copper tubes, the 180° bend(s) for one of the tubes is made within the aluminum plate (that is, in-plane), while the other tube bend(s) is made out of the aluminum plate (that is, out-of-plane), creating the desired serpentine overlay pattern. This increases the amount of tube passes in contact with the thermal spreader, and thus in contact with the heat source, resulting in a better thermal solution than traditional serpentine overlay patterns. Advantageously, the approaches described herein increase the number of tube passes over a thermal spreader, with a defined or limited surface area, as compared with other heat transfer solutions.

Figure 7A:
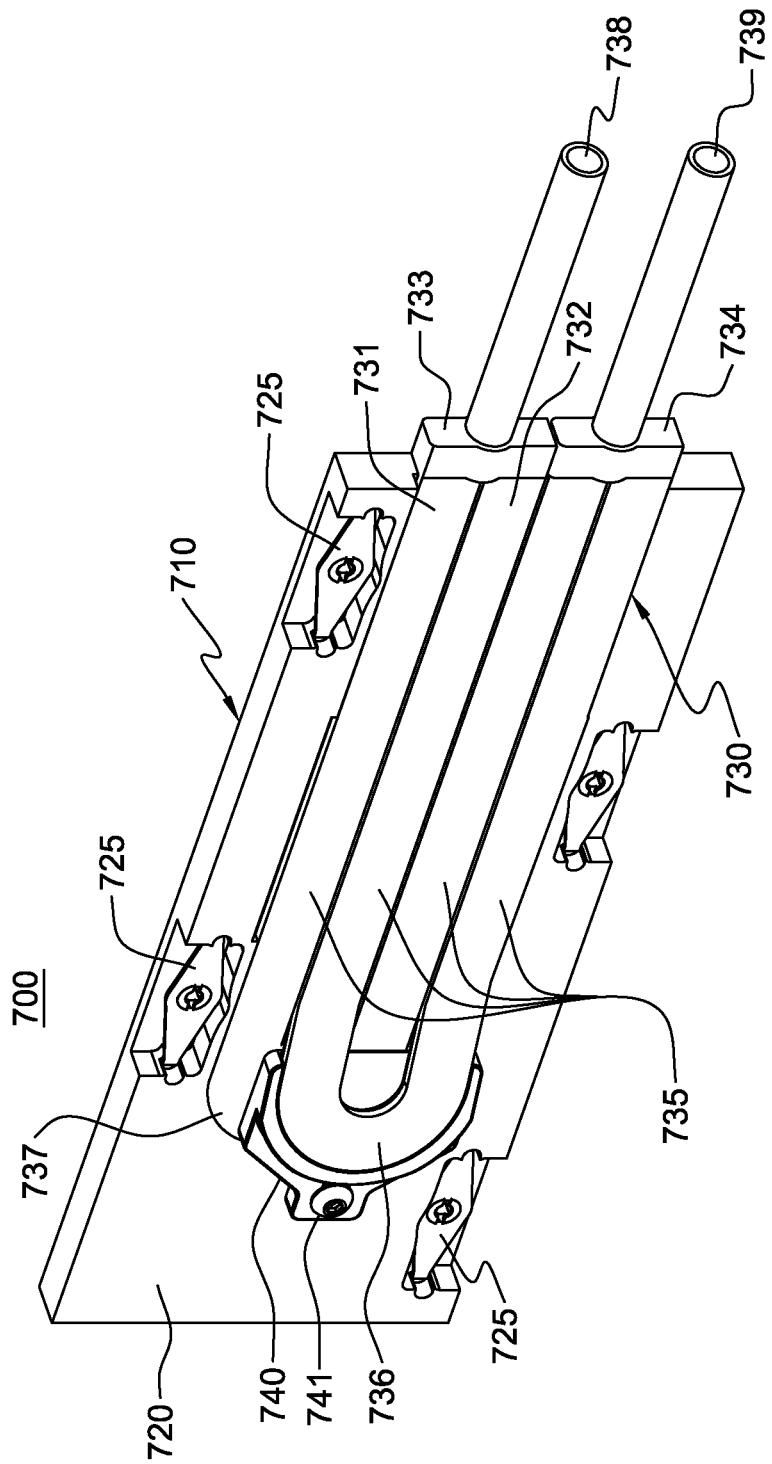
FIG. 7A partially depicts another embodiment of a cooling apparatus comprising a thermal transfer structure for cooling, by way of example, an electronics card (not shown), in accordance with one or more aspects of the present invention.
Figure 7B:
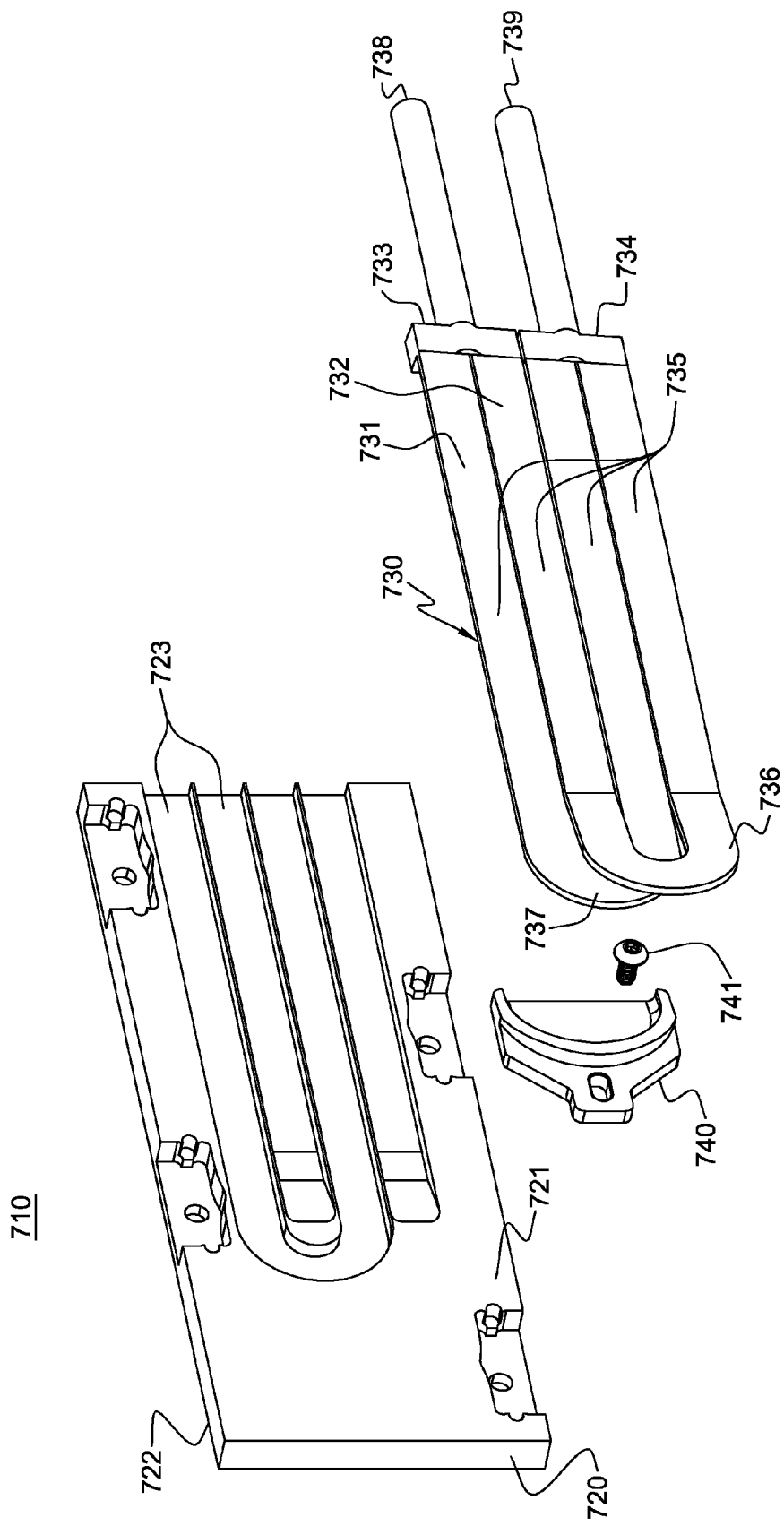
FIG. 7B is a partially exploded depiction of the thermal transfer structure of FIG. 7A, in accordance with one or more aspects of the present invention.

Referring next to FIGS. 7A & 7B collectively, one embodiment of a cooling apparatus 700 is depicted. Cooling apparatus 700 is shown to comprise a thermal transfer structure 710 which includes a thermal spreader 720, a coolant-carrying tube assembly 730, which in this example, includes multiple coolant-carrying tubes, 731, 732 coupled to and in thermal contact with thermal spreader 720. In the depicted example, the coolant-carrying tubes 731, 732 of tube assembly 730 are at least partially embedded within thermal spreader 720, with the first coolant-carrying tube 731 and second coolant-carrying tube 732 fluidically coupled in parallel between a coolant supply manifold 733 and a coolant return manifold 734 of coolant-carrying tube assembly 730. Coolant supply manifold 733 receives liquid coolant via a coolant inlet 738 and coolant is exhausted from coolant return manifold 734 through a coolant outlet 739. In one embodiment, coolant inlet 738 and coolant outlet 739 may be configured with quick connect couplings to facilitate fluidic attachment of the thermal transfer structure to corresponding connectors of a coolant system associated with, for example, an electronic system or an electronics rack. By way of example, the quick connect couplings may comprise any one of various types of commercially available couplings, such as those available from Colder Products, Company, St. Paul, Minn., USA, or Parker Hannifin, of Cleveland, Ohio, USA.

In this example, multiple tube lengths 735 are provided by the first coolant-carrying tube 731 and second coolant-carrying tube 732. These multiple tube lengths are disposed substantially coplanar or in a common plane so as to extend, in this example, substantially in parallel, with little or no space therebetween. As noted, this arrangement is possible by the provision of an out-of-plane tube bend 736, such as an out-of-plane 180° tube bend, as well as an in-plane tube bend 737, such as an in-plane 180° tube bend. The thermal spreader may be machined with appropriate recesses 723 in the one side 721 of thermal spreader 720 to receive the coolant-carrying tube assembly 730 and ensure good thermal contact between the structures. The opposite main side 722 of thermal spreader 720 may be configured as a flat surface to engage one or more electronic components to be cooled, or may be machined to comprise one or more recesses or openings, sized and configured to receive corresponding electronic components therein, and thereby facilitate good thermal conduction from the one or more electronic components to be cooled to the thermal transfer structure 710. A wedge support 740 is affixed via, for instance, a fastener 741, to thermal spreader 720, and is sized and configured to support the out-of-plane tube bend 736, as illustrated in FIGS. 7A & 7B.

Note that FIG. 7B depicts an exploded view of the thermal transfer structure to illustrate how the thermal spreader can be machined to provide recessed and extra support for the coolant-carrying tube(s) that has the out-of-plane tube bend(s) from the common plane (e.g., surface plane) of the thermal spreader. The wedge support is one embodiment of an additional feature that can be added to the thermal transfer structure to further protect the out-of-plane tube bend extending out from the surface of the thermal spreader.

As depicted in FIG. 7C, one or more fasteners 725, such as spring-biased fastening mechanisms, may be employed to couple the thermal transfer structure 710 to, for instance, an electronics card 440, for instance, by clamping electronics card 440 between thermal spreader 720 of the thermal transfer structure 710, and a stiffener 701 disposed at an opposite main side of electronics card 440. As illustrated in FIG. 7C, the thermal transfer structure 710 is, in one embodiment, configured to reside within a serviceable or field-replaceable unit 430', which itself is configured for operative insertion into an electronic system via, for instance, interposer card 460, and appropriately configured quick connect couplings coupled to coolant inlet 738 and coolant outlet 739, mating to respective connectors (not shown) of the electronic system within which the field-replaceable unit is operatively inserted. In this embodiment, electronics card 440 may operatively insert within interposer card 460, in a manner similar to that described in connection with the embodiments of FIGS. 4-5C.

Note that in the embodiment of FIGS. 7A-7C, more tube length passes are provided over the main surface of the thermal spreader than achievable using traditional serpentine tube overlay and spreader techniques. This is achieved, at least in part, in the thermal transfer structure depicted, by the tube bends being overlaid so as to interlock or intertwine in plan view. The tube overlaying can be accomplished by adding the out-of-plane tube bend(s) to one of the two coolant-carrying tubes. This additional bend (or bends), so as to extend the coolant-carrying tube out-of-plane, is accomplished (in one embodiment) just before the 180° turn of the tube. The bend is accomplished out of the thermal spreader surface plane to more closely space the tube passes or lengths within the thermal spreader. The two coolant-carrying tubes of the embodiment of FIGS. 7A-7C employ a parallel coolant flow approach, and the configuration depicted increases the number of tube lengths across the surface of the thermal spreader, for instance, where space is limited, and at the same time, increases the tube surface area exposed to the thermal spreader, or possibly the heat source directly, depending upon whether openings are provided through the thermal spreader to allow for one or more electronic components to physically contact one or more of the tube lengths.

Figure 8B:
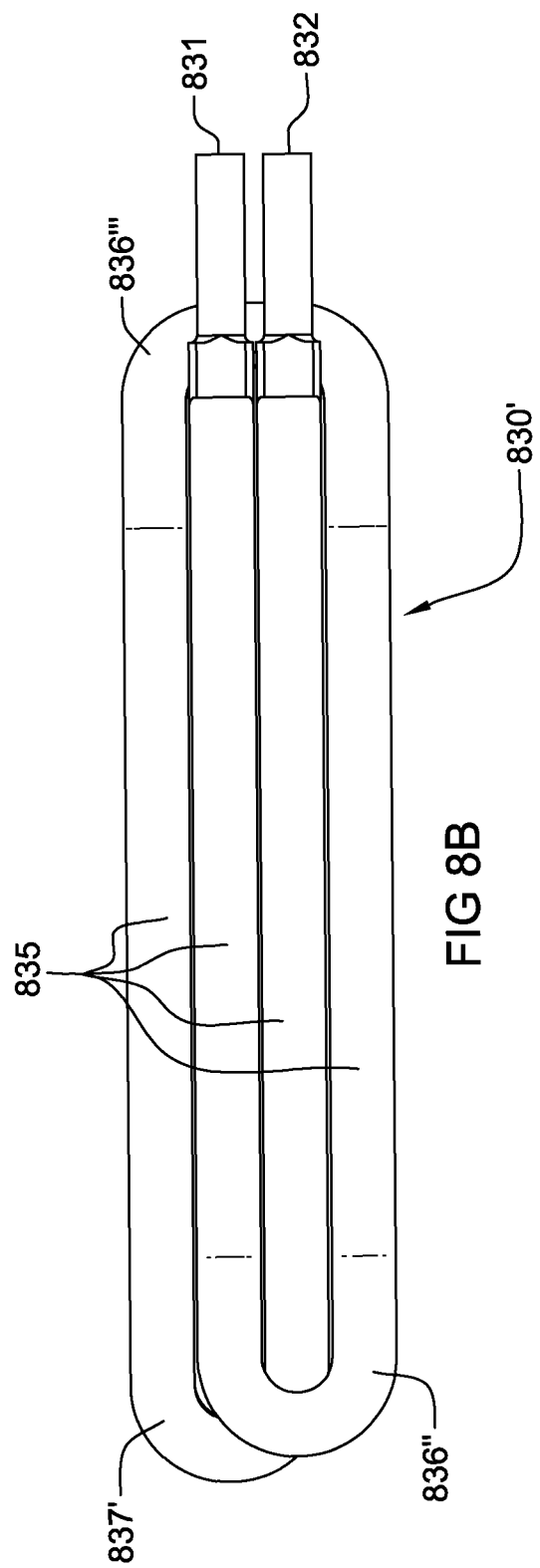
FIG. 8B depicts another embodiment of a coolant-carrying tube assembly for the thermal transfer structure of FIG. 8A, in accordance with one or more aspects of the present invention.
Figure 8C:
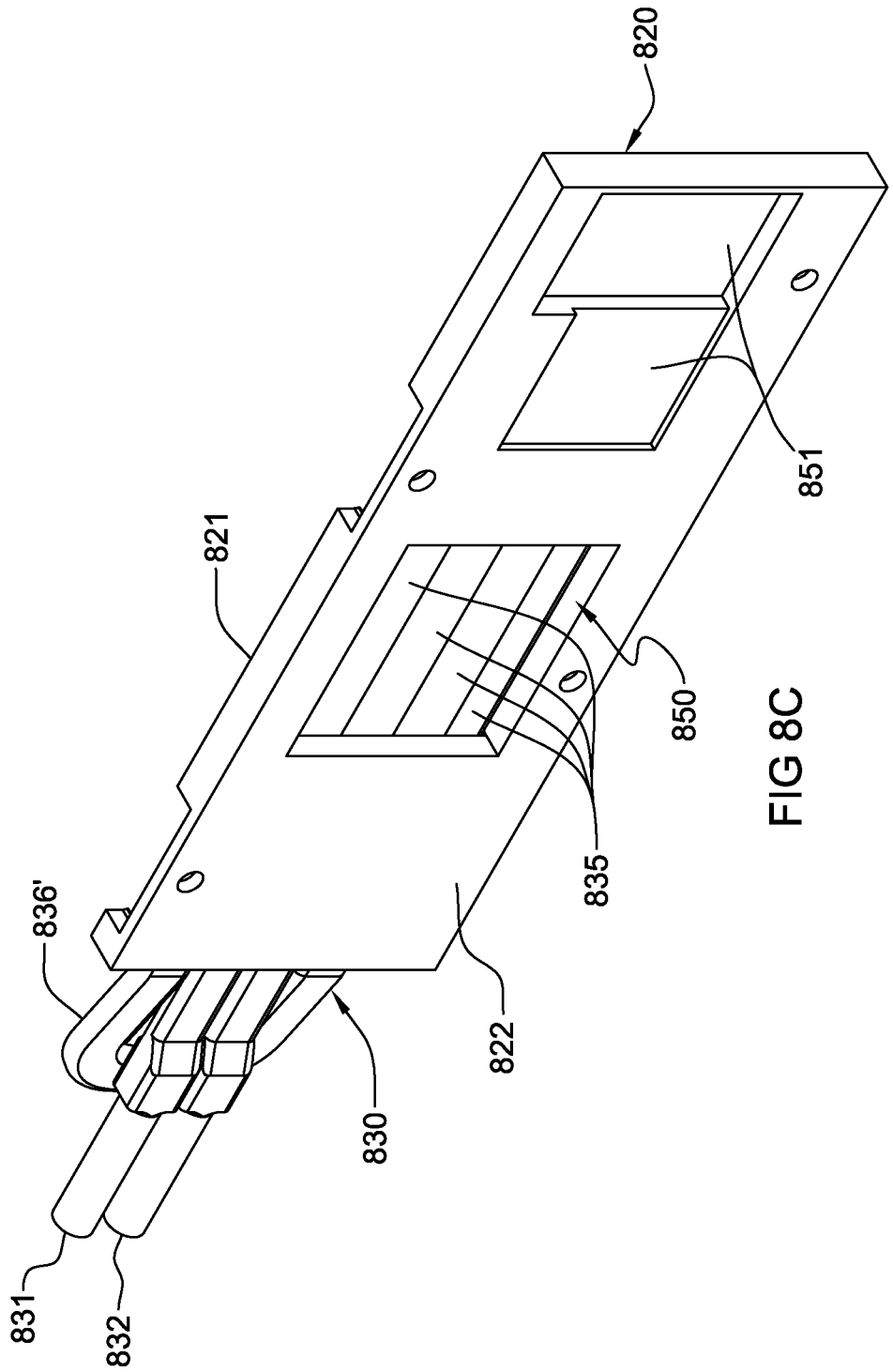
FIG. 8C is an opposite side view of one embodiment of the thermal transfer structure of FIG. 8A, in accordance with one or more aspects of the present invention.

FIGS. 8A-8C depict an alternate embodiment of a cooling apparatus 800 comprising a thermal transfer structure 810, which includes a thermal spreader 820, and a coolant-carrying tube assembly 830, which in this example, comprises a single coolant-carrying tube coupled to and in thermal contact with thermal spreader 820. In the depicted example, the single coolant-carrying tube of coolant-carrying tube assembly 830 is at least partially embedded within thermal spreader 820. Coolant is received into the coolant-carrying tube via a coolant inlet 831 and is exhausted from the coolant-carrying tube via a coolant outlet 832, both of which may be configured with quick connect couplings to facilitate fluidic attachment of the thermal transfer structure to corresponding connectors of a coolant system associated with, for instance, an electronic system or an electronics rack within which the thermal transfer structure is to be operatively inserted.

As with the embodiment of FIGS. 7A-7C, multiple tube lengths 835 are provided by the coolant-carrying tube assembly 830. These multiple tube lengths 835 are disposed substantially coplanar or in a common plane so as to extend, in this example, substantially in parallel, with little or no space therebetween. This arrangement is made possible in this example by the provision of multiple out-of-plane tube bends 836, 836', such as out-of-plane 180° tube bends, as well as an in-plane tube bend 837, such as an in-plane 180° tube bend. Appropriate recesses (not shown) may be provided or machined into the one side 821 of thermal spreader 820, to receive the coolant-carrying tube assembly 830 in good thermal contact with the thermal spreader. The opposite main side 822 of thermal spreader 820 may be configured as a flat surface to engage one or more electronic components to be cooled, or may comprise one or more recesses 851 and/or openings 850, as illustrated in FIG. 8C. These recesses and/or openings are sized and configured to receive corresponding electronic components (not shown) therein, and thereby facilitate good thermal conduction from the one or more electronic components to be cooled to the thermal transfer structure 810. Note that opening 850 in the second main side 822 of thermal spreader 820 exposes portions of the coplanar tube lengths 835 of the coolant-carrying tube assembly 830. By sizing the thickness of thermal spreader 820 to, for instance, approximate the thickness of the component to reside within opening 850, the component itself may be in direct contact with the exposed tube lengths 835 for more direct heat transfer from the electronic component within the opening to the coolant flowing through the coolant-carrying tube assembly 830.

In this implementation, a wedge support 840 is affixed via, for instance, a fastener, to thermal spreader 820, and is sized and configured to support the out-of-plane tube bend 836 at least partially overlying the in-plane tube bend 837 on the left side of the thermal transfer structure 810 depicted in FIG. 8A.

The other out-of-plane tube bend 836' extends past an edge 823 of thermal spreader 820, in this example, so as the lie outside of the thermal spreader. Note that, in this implementation, this out-of-plane tube bend 836' extends over (or is above) the straight tube portions comprising the coolant inlet 831 and coolant outlet 832.

In this regard, FIG. 8B depicts an alternate arrangement of coolant-cooled tube assembly 830', which again illustrates multiple tube lengths 835, two out-of-plane tube bends 836", 836''', and an in-plane tube bend 837'. In this example, the out-of-plane tube bend 836''', which extends beyond the edge 823 (see FIG. 8A) of thermal spreader 820, is disposed below the straight tube portions comprising the coolant inlet 831 and coolant outlet 832, by way of additional example.

Figure 9A:
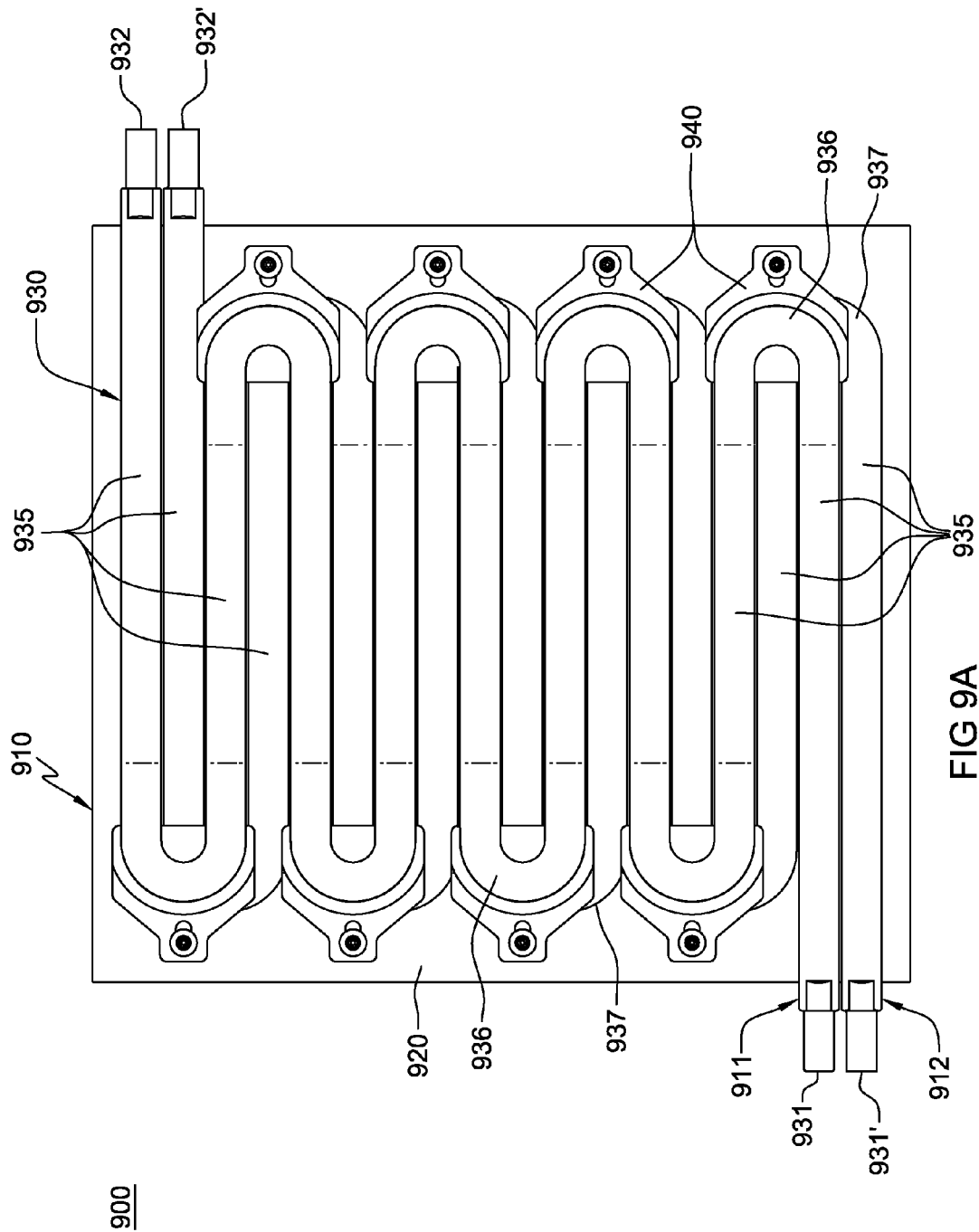
FIG. 9A is an alternate embodiment of a thermal transfer structure of a cooling apparatus, in accordance with one or more aspects of the present invention.
Figure 9B:
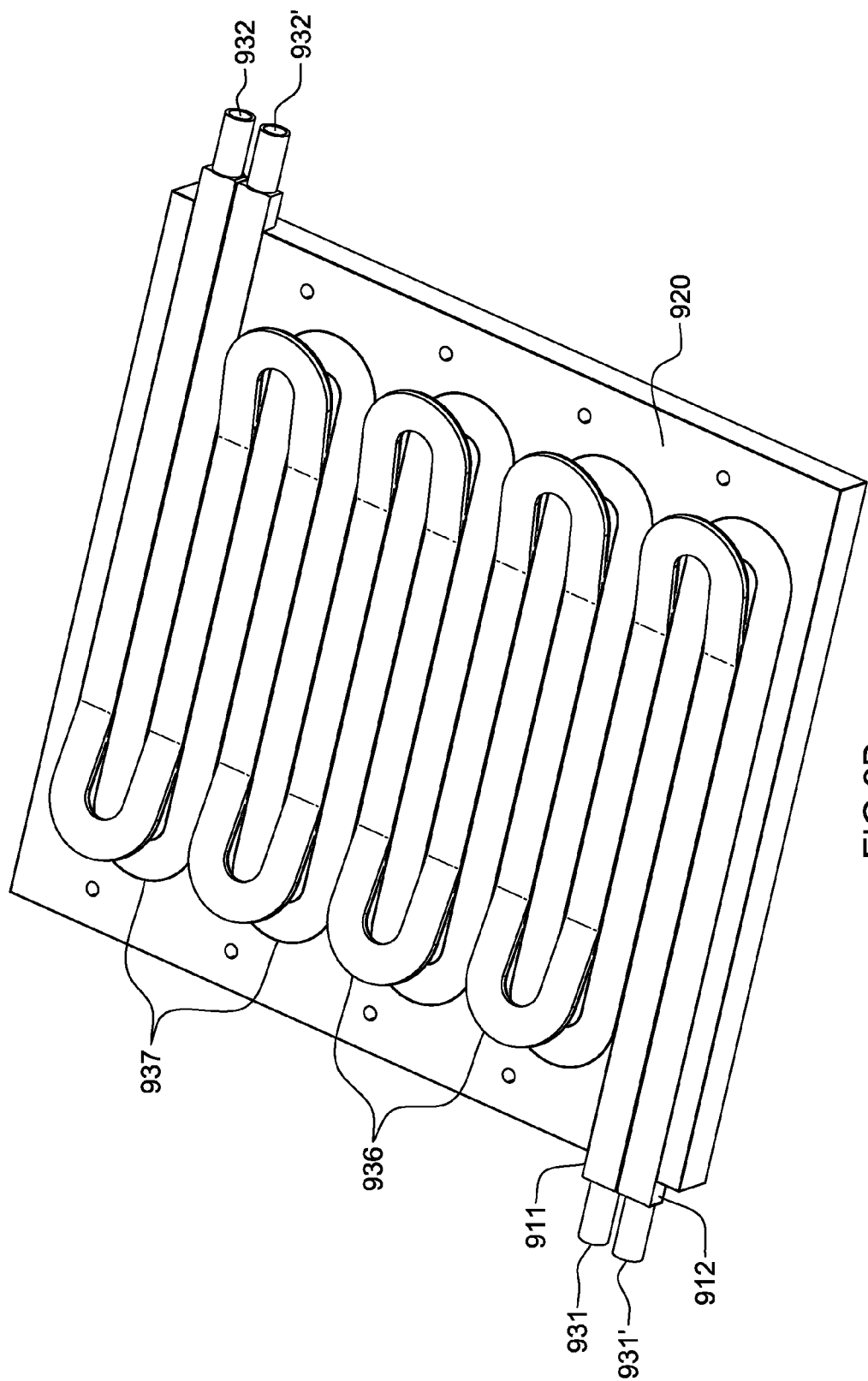
FIG. 9B depicts the thermal transfer structure of FIG. 9A, shown with the wedge supports removed to better illustrate the underlying, in-plane tube bends and the out-of-plane tube bends interlocked, in accordance with one or more aspects of the present invention.
Figure 9C:
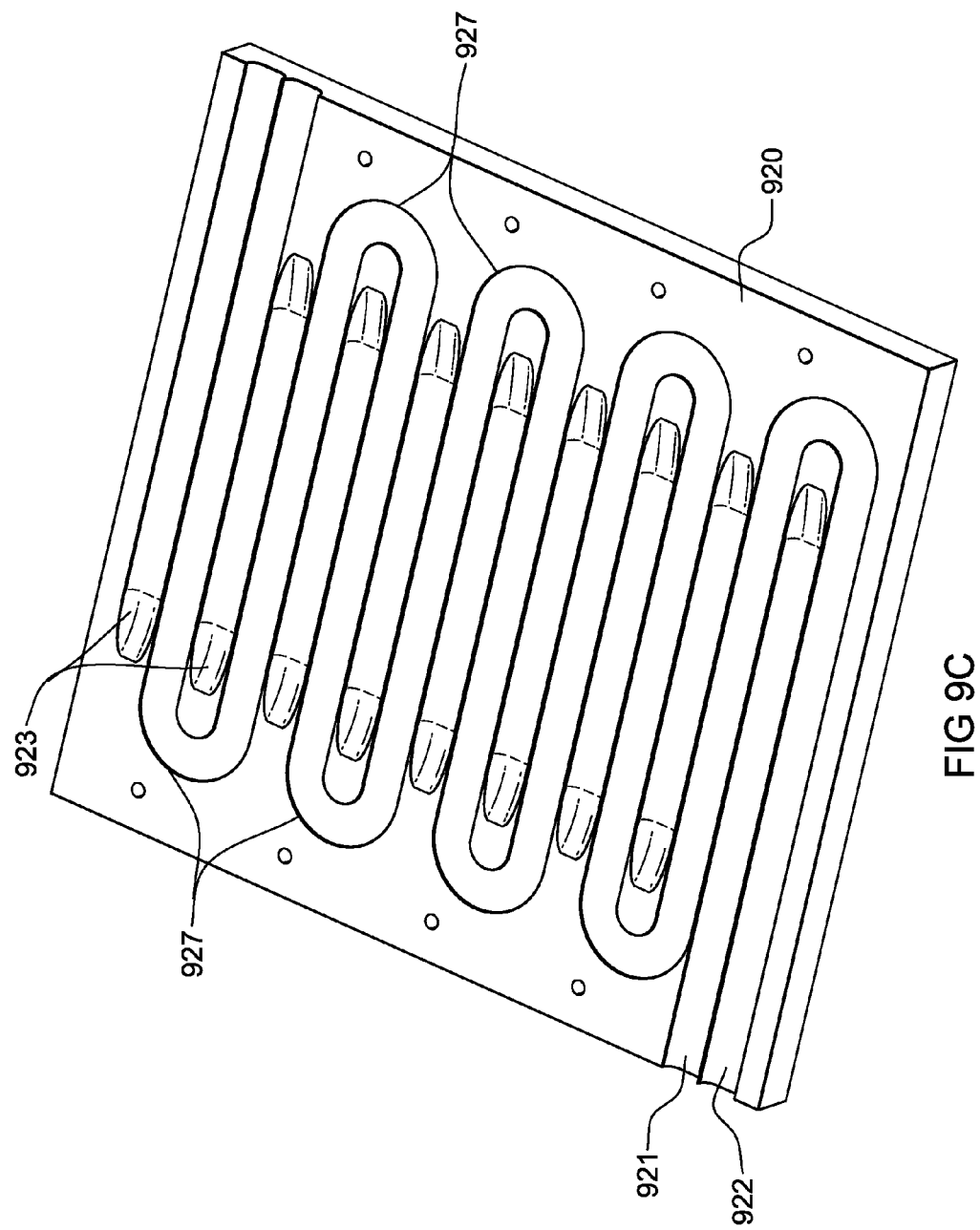
FIG. 9C depicts the thermal spreader of the thermal transfer structure of FIGS. 9A & 9B, with the coolant-carrying tubes removed, in accordance with one or more aspects of the present invention.

Referring collectively to FIGS. 9A-9C, a further embodiment of a cooling apparatus 900, in accordance with one or more aspects of the present invention, is shown. Cooling apparatus 900 is shown to comprise a thermal transfer structure 910 which includes a larger thermal spreader 920 than the embodiments described above in connection with FIGS. 7A-8C. This larger thermal transfer structure 910 may be appropriate for coupling to a larger assembly or subassembly of electronic components to be cooled. In this embodiment, thermal transfer structure 910 includes, in addition to thermal spreader 920, a coolant-carrying tube assembly 930, which (by way of example) comprises a first coolant-carrying tube 911 and a second coolant-carrying tube 912 in thermal contact with thermal spreader 920. In the depicted example, coolant-carrying tubes 911, 912 of tube assembly 930 are at least partially fitted or embedded within thermal spreader 920, and both tubes are arranged in a serpentine overlay pattern as illustrated.

In this example, coolant is supplied via a coolant inlet 931 to first coolant-carrying tube 911, and is exhausted via a coolant outlet 932, and is supplied via a coolant inlet 931' to second coolant-carrying tube 912, and exhausted via a coolant outlet 932'. Note that as an alternate embodiment, manifolding could be provided at the coolant inlets and/or coolant outlets, if desired. Note also that the particular placement of the coolant inlets 931, 931' and coolant outlets 932, 932' at opposite edges 923, 924 of thermal spreader 920, is presented by way of example only. In other embodiments, the coolant inlets and coolant outlets could be disposed at the same side-edge of the thermal spreader, depending (in part) on the size and configuration of the thermal spreader, as well as the configuration of the coolant assembly to which the thermal transfer structure is to fluidically couple. As in the embodiments described above, coolant inlets 931, 931', and coolant outlets 932, 932', may be configured with quick connect couplings to facilitate fluidic attachment of the thermal transfer structure 910 to corresponding connectors of a coolant system associated with, for instance, an electronic system or an electronics rack, within which the electronic components to be cooled are disposed.

In this example, multiple tube lengths 935 are provided by the first coolant-carrying tube 911 and second coolant-carrying tube 912. These multiple tube lengths are disposed substantially coplanar (or in a common plane) so as to extend, in this example, substantially in parallel, with little or no space therebetween. As noted, this arrangement is possible, at least in part, by provision of out-of-plane tube bends 936 in, for instance, first coolant-carrying tube 911. These out-of-plane tube bends 936 may each comprise an out-of-plane 180° tube bend, as illustrated in FIGS. 9A & 9B. In this embodiment, the second coolant-carrying tube 912 includes multiple in-plane tube bends 937, which are disposed (for example) in the common plane of the multiple tube lengths 935.

As illustrated in FIGS. 9A & 9B, the offset, out-of-plane tube bends 936 and in-plane tube bends 937 of the first and second coolant-carrying tubes 911, 912, overlay in an interlocked or intertwined configuration, with the out-of-plane tube bends 936 of first coolant-carrying tube 911, in part overlying and underlying in-plane tube bends 937 of second coolant-carrying tube 912. This is facilitated, in part, by provision of machined recesses 921, 922 within thermal spreader 920, as illustrated in FIG. 9C, which include in-plane tube bend recesses 927 for the in-plane tube bends 937, and sloped portions 923, which facilitate the out-of-plane tube bends 936 projecting from the common plane of the multiple tube lengths 935, that is, out from the main surface or plane of the thermal spreader 920 to which the coolant-carrying tube assembly 930 is coupled.

Wedge supports 940 are affixed via fasteners 941 to thermal spreader 920, and are sized and configured to support the out-of-plane tube bends 936, as illustrated in FIG. 9A. Note again that the opposite main side of the thermal spreader 920 (not shown) may be configured as a flat surface to engage one or more electronic components to be cooled, or may be configured or machined with lands or recesses (or openings), sized and configured to engage or receive corresponding electronic components therein, and thereby facilitate good thermal conduction from the one or more electronic components to be cooled to the thermal transfer structure 910.

By way of specific example, the thermal transfer structure 910 of FIGS. 9A-9C may comprise a thermal spreader which is fabricated as a large aluminum plate, with a coolant-carrying tube assembly which includes two serpentine copper tubes 911, 912, with multiple interleaving (or interlocking) bends. This configuration is advantageous where the number of tube lengths exceeds, for instance, four passes. Further, in the configuration of FIGS. 9A-9C, the supply and return manifolds are unnecessary, and only a transition from the rectangular or "D-shaped" coolant-flow transverse cross-section of the coolant-carrying tubes 911, 912, to a standard, circular cross-section at the coolant inlet 931, 931' and coolant outlet 932, 932' locations, is needed, which is a common transition available in the industry. Note also that the coolant-carrying tubes could be arranged so that the tube inlets and tube outlets could be disposed at any corner of the respective thermal spreader, on the same thermal spreader edge or different thermal spreader edges.

Figure 10A:
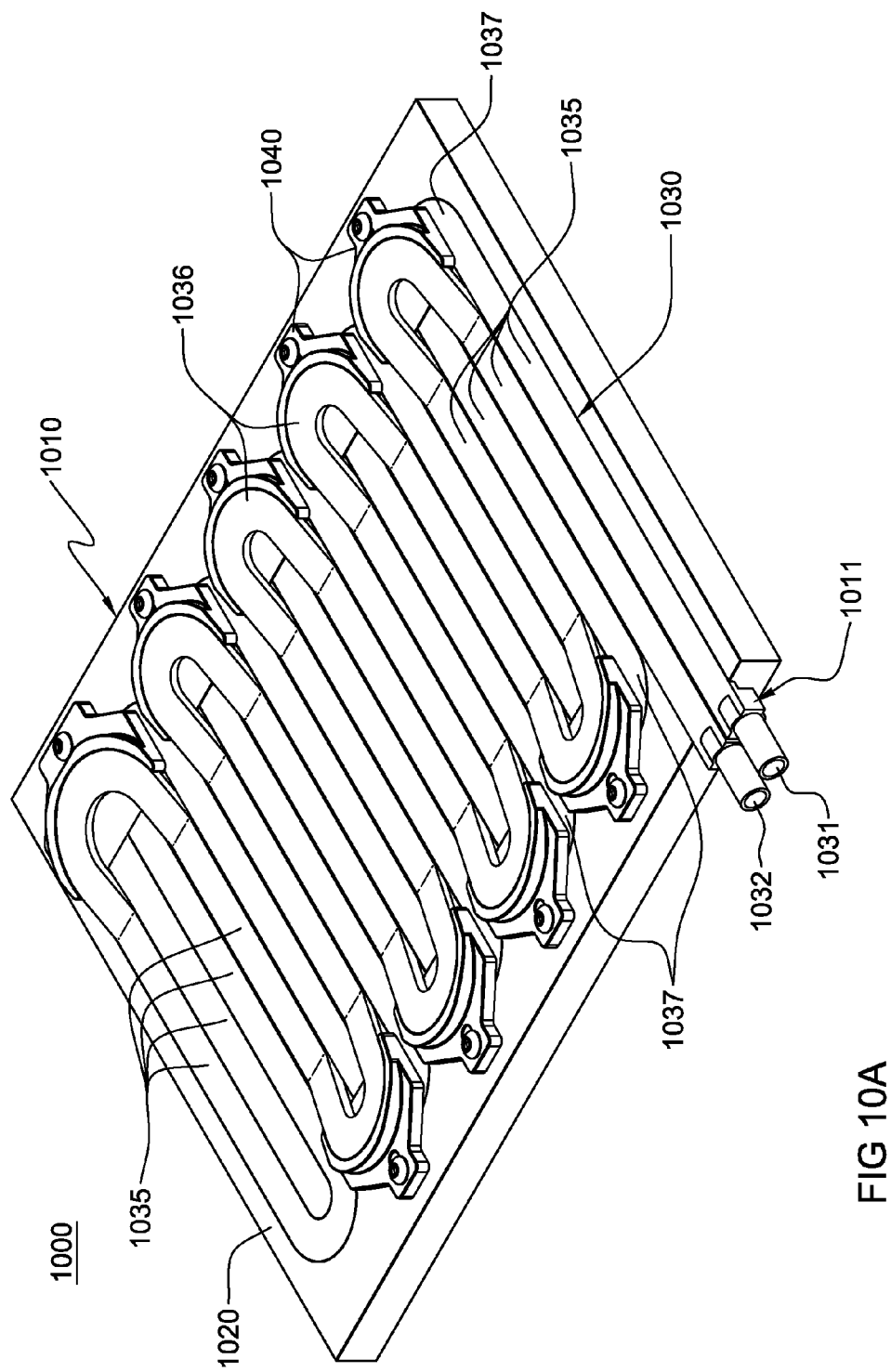
FIG. 10A depicts another alternate embodiment of a thermal transfer structure of a cooling apparatus, in accordance with one or more aspects of the present invention.
Figure 10B:
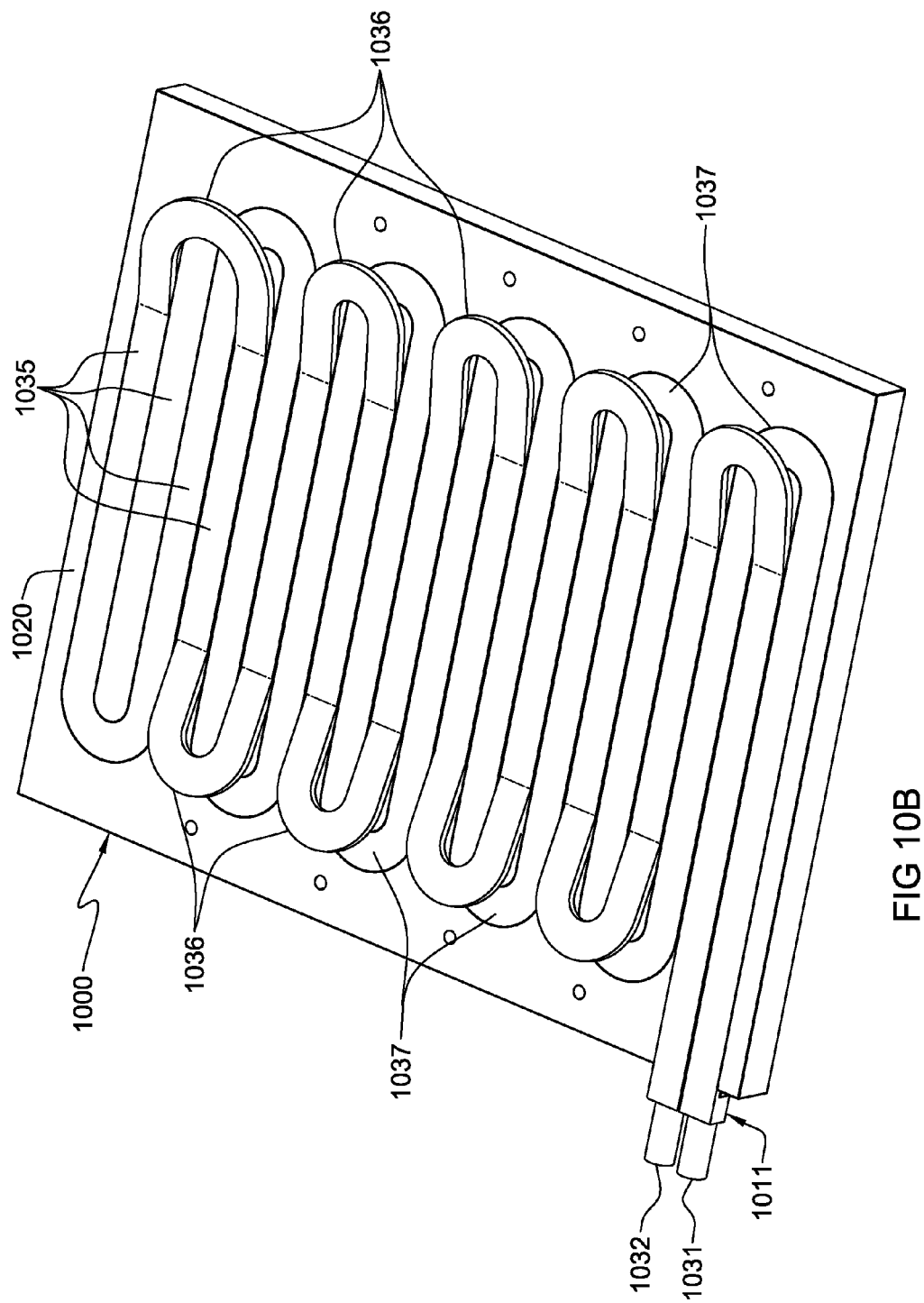
FIG. 10B depicts the thermal transfer structure of FIG. 10A, with the wedge supports removed to better illustrate the in-plane tube bends and the out-of-plane tube bends interlocked, in accordance with one or more aspects of the present invention.

FIGS. 10A & 10B depict a further embodiment of a cooling apparatus 1000, in accordance with one or more aspects of the present invention. Referring collectively to these figures, in this embodiment, cooling apparatus 1000 is shown to comprise a thermal transfer structure 1010, which includes a thermal spreader 1020, and a coolant-carrying tube assembly 1030. The coolant-carrying tube assembly 1030 is defined via a single coolant-carrying tube 1011 at least partially embedded within one side of thermal spreader 1020. Coolant is supplied via a coolant inlet 1031 to coolant-carrying tube 1011, and is exhausted via a coolant outlet 1032 of coolant-carrying tube 1011. In one embodiment, coolant inlet 1031 and coolant outlet 1032 are configured with quick connect couplings (not shown) to facilitate fluidic attachment of the thermal transfer structure to corresponding connectors of a coolant system associated with, for instance, an electronic system or an electronics rack comprising one or more electronic components to be cooled.

As in the embodiments described above, multiple tube lengths 1035 are provided by the coolant-carrying tube 1011 being disposed in a serpentine overlay pattern. These multiple tube lengths are disposed substantially coplanar or in a common plane so as to extend, in this example, substantially parallel, with little or no space therebetween. As noted, this arrangement is made possible by the provision of out-of-plane tube bends 1036, such as out-of-plane 180° tube bends, as well as in-plane tube bends 1037, such as in-plane 180° tube bends. Appropriate recesses (not shown) may be provided or machined in the one side of thermal spreader 1020 into which the coolant-carrying tube assembly 1030 is fitted or embedded in good thermal contact. The opposite main side of the thermal spreader 1020 may be configured as a flat surface to engage one or more electronic components to be cooled, or may comprise one or more lands, recesses, openings, etc., sized and configured to engage or receive corresponding electronic components to be cooled, and thereby facilitate good thermal conduction from the one or more electronic components to the thermal transfer structure 1010. Support wedges 1040 may be affixed via, for instance, fasteners 1041, to thermal spreader 1020, and be sized and configured to support the out-of-plane tube bends 1036, as illustrated in FIGS. 10A & 10B.

Those skilled in the art will note from the examples provided herein, that in certain aspects, one or more cooling apparatuses comprising thermal transfer structures are provided, wherein the number of coolant-carrying tube passes or tube lengths across the surface of a thermal spreader are increased over what is conventionally achievable using a serpentine overlay pattern, thereby resulting in improved thermal performance of the thermal transfer structure. In particular, the thermal transfer structures described herein increase the number of tube passes or lengths in contact with the thermal spreader and/or in direct contact with the electronic components (or heat sources) to be cooled for a specific area, as compared with prior approaches. This results in a better thermal solution that traditional serpentine overlay patterns can achieve. By way of example, a single coolant-carrying tube (e.g., copper tube) or multiple coolant-carrying tubes, may be embedded within a thermal spreader (e.g., aluminum plate) following a serial serpentine overlay pattern for a single tube, or parallel serpentine overlay pattern for two or more tubes. Depending upon the implementation, the coolant-carrying tubes embedded within the thermal spreader may be in direct contact with one or more electronic components to be cooled. The enhanced coverage area is achieved by providing one or more out-of-plane tube bends, for instance, one or more 180° out-of-plane tube bends, which project out, for instance, at an angle greater than 0°, from the coplanar tube lengths and in-plane tube bends of the remaining portions of the coolant-carrying tube assembly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
   a thermal transfer structure, the thermal transfer structure comprising:
   a thermal spreader;
   at least one coolant-carrying tube coupled to and in thermal contact with the thermal spreader, the at least one coolant-carrying tube comprising:
   multiple tube lengths disposed substantially in a common plane;
   at last one out-of-plane tube bend, one out-of-plane tube bend of the at least one out-of-plane tube bend coupling in fluid communication a first tube length and a second tube length of the multiple tube lengths, the one out-of-plane tube bend extending out-of-plane from the multiple tube lengths disposed in the common plane;
   at least one in-plane tube bend, one in-plane tube bend of the at least one in-plane tube bend coupling in fluid communication a third tube length and a fourth tube length of the multiple tube lengths, the one in-plane tube bend extending in the common plane of the multiple tube lengths;
   wherein the first tube length and the second tube length are spaced apart, with the third tube length of the multiple tube lengths disposed therebetween; and
   wherein the one out-of-plane tube bend coupling the first tube length and the second tube length overlies, at least in part, and extends out-of-plane from the one in-plane tube bend coupling in fluid communication the third tube length and the fourth tube length; and
   a support wedge disposed between the one out-of-plane tube bend and the one in-plane tube bend, the support wedge being configured to support the one out-of-plane tube bend.

2. A cooling apparatus comprising:
   a thermal transfer structure, the thermal transfer structure comprising:
   a thermal spreader; and
   at least one coolant-carrying tube coupled to and in thermal contact with the thermal spreader, the at least one coolant-carrying tube comprising:
   multiple tube lengths disposed substantially in a common plane;
   at last one out-of-plane tube bend, one out-of-plane tube bend of the at least one out-of-plane tube bend coupling in fluid communication a first tube length and a second tube length of the multiple tube lengths, the one out-of-plane tube bend extending out-of-plane from the multiple tube lengths disposed in the common plane;

at least one in-plane tube bend, one in-plane tube bend of the at least one in-plane tube bend coupling in fluid communication a third tube length and a fourth tube length of the multiple tube lengths, the one in-plane tube bend extending in the common plane of the multiple tube lengths;

wherein the first tube length and the second tube length are spaced apart, with the third tube length of the multiple tube lengths disposed therebetween; and wherein the one out-of-plane tube bend coupling the first tube length and the second tube length overlies, at least in part, and extends out-of-plane from the one in-plane tube bend coupling in fluid communication the third tube length and the fourth tube length; and wherein the thermal transfer structure comprises a first coolant-carrying tube and a second coolant-carrying tube, the first coolant-carrying tube comprising the first tube length, the second tube length, and the out-of-plane tube bend, and the second coolant-carrying tube comprising the third tube length, the fourth tube length, and the in-plane tube bend.

3. The cooling apparatus of claim 2, wherein the thermal transfer structure further comprises a coolant supply manifold and a coolant return manifold, the first coolant-carrying tube and the second coolant-carrying tube being fluidically coupled in parallel between the coolant supply manifold and the coolant return manifold of the thermal transfer structure.

4. The cooling apparatus of claim 1, wherein the at least one coolant-carrying tube is at least partially embedded within the thermal spreader, and the multiple tube lengths are disposed in parallel and cover a majority of one side of the thermal spreader.

5. The cooling apparatus of claim 1, wherein the one out-of-plane tube bend resides over the thermal spreader.

6. The cooling apparatus of claim 1, wherein the one out-of-plane tube bend extends past an edge of the thermal spreader.

7. The cooling apparatus of claim 1, wherein the thermal spreader comprises a first thermally conductive material, and the at least one coolant-carrying tube comprises a second thermally conductive material, the first thermally conductive material and the second thermally conductive material being different materials.

8. The cooling apparatus of claim 7, wherein the first thermally conductive material comprises aluminum and the second thermally conductive material comprises copper, and wherein the thermal spreader is a thermal-spreading plate.

9. The cooling apparatus of claim 1, wherein one side of the thermal spreader is configured to couple to at least one electronic component to be cooled, and the at least one coolant-carrying tube is at least partially embedded within another side of the thermal spreader, the one side and the another side being opposite main sides of the thermal spreader.

10. The cooling apparatus of claim 9, wherein at least one tube length of the multiple tube lengths directly contacts an electronic component of the at least one electronic component to be cooled through an opening in the thermal spreader within which the electronic component at least partially resides.

11. A coolant-cooled electronic assembly comprising:
at least one electronic component to be cooled;
a cooling apparatus, the cooling apparatus comprising:
a thermal transfer structure coupled to the at least one electronic component to be cooled to facilitate dissipation of heat from the at least one electronic component, the thermal transfer structure comprising:
a thermal spreader;
at least one coolant-carrying tube coupled to and in thermal contact with the thermal spreader, the at least one coolant-carrying tube comprising:
multiple tube lengths disposed substantially in a common plane;
at least one out-of-plane tube bend, one out-of-plane tube bend of the at least one out-of-plane tube bend coupling in fluid communication a first tube length and a second tube length of the multiple tube lengths, the one out-of-plane tube bend extending out-of-plane from the common plane in which the multiple tube lengths are substantially disposed;
at least one in-plane tube bend, one in-plane tube bend of the at least one in-plane tube bend coupling in fluid communication a third tube length and a fourth tube length of the multiple tube lengths, the one in-plane tube bend extending in the common plane of the multiple tube lengths;
wherein the first tube length and the second tube length are spaced apart, with the third tube length of the multiple tube lengths disposed therebetween; and
wherein the one out-of-plane tube bend coupling the first tube length and the second tube length overlies, at least in part, and extends out-of-plane from the one in-plane tube bend coupling in fluid communication the third tube length and the fourth tube length; and
a support wedge disposed between the one out-of-plane tube bend and the one in-plane tube bend, the support wedge being configured to support the one out-of-plane tube bend.

12. The coolant-cooled electronic assembly of claim 11, wherein the at least one coolant-carrying tube is at least partially embedded within the thermal spreader, and the multiple tube lengths are disposed in parallel and cover a majority of one side of the thermal spreader.

* * * * *